United States Patent
Park et al.

(10) Patent No.: US 10,043,799 B2
(45) Date of Patent: Aug. 7, 2018

(54) METHOD OF MANUFACTURING SEMICONDUCTOR DEVICE USING SURFACE TREATMENT AND SEMICONDUCTOR DEVICE MANUFACTURED BY THE METHOD

(71) Applicant: Samsung Electronics Co., Ltd., Suwon-si (KR)

(72) Inventors: Jaeyoung Park, Yongin-si (KR); Sungho Kang, Osan-si (KR); Kichul Kim, Seongnam-si (KR); Sunyoung Lee, Yongin-si (KR); Han Ki Lee, Hwaseong-si (KR); Bonyoung Koo, Suwon-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/407,598

(22) Filed: Jan. 17, 2017

(65) Prior Publication Data

US 2017/0125418 A1 May 4, 2017

Related U.S. Application Data

(63) Continuation of application No. 14/543,820, filed on Nov. 17, 2014, now Pat. No. 9,576,840.

(30) Foreign Application Priority Data

Nov. 26, 2013 (KR) .......................... 10-2013-0144680

(51) Int. Cl.
*H01L 21/336* (2006.01)
*H01L 21/302* (2006.01)
(Continued)

(52) U.S. Cl.
CPC ...... *H01L 27/0886* (2013.01); *H01L 21/0206* (2013.01); *H01L 21/306* (2013.01);
(Continued)

(58) Field of Classification Search
None
See application file for complete search history.

(56) References Cited

U.S. PATENT DOCUMENTS

| 6,470,824 B2 | 10/2002 | Kawakami et al. |
| 6,811,956 B1 | 11/2004 | Gabriel |

(Continued)

FOREIGN PATENT DOCUMENTS

| CN | 102117737 A | 7/2011 |
| KR | 10-1999-0080622 | 11/1999 |

(Continued)

*Primary Examiner* — Calvin Choi
(74) *Attorney, Agent, or Firm* — Muir Patent Law, PLLC

(57) ABSTRACT

A method of manufacturing a semiconductor device includes forming a first plurality of recessed regions in a substrate, the substrate having a protruded active region between the first plurality of recessed regions and the protruded active region having an upper surface and a sidewall, forming a device isolation film in the first plurality of recessed regions, the device isolation film exposing the upper surface and an upper portion of the sidewall of the protruded active region, and performing a first plasma treatment on the exposed surface of the protruded active region, wherein the plasma treatment is performed using a plasma gas containing at least one of an inert gas and a hydrogen gas in a temperature of less than or equal to about 700° C.

15 Claims, 33 Drawing Sheets

(51) Int. Cl.

| | |
|---|---|
| *H01L 21/461* | (2006.01) |
| *H01L 27/088* | (2006.01) |
| *H01L 29/34* | (2006.01) |
| *H01L 29/06* | (2006.01) |
| *H01L 29/08* | (2006.01) |
| *H01L 21/306* | (2006.01) |
| *H01L 21/8234* | (2006.01) |
| *H01L 21/762* | (2006.01) |
| *H01L 21/02* | (2006.01) |
| *H01L 29/66* | (2006.01) |
| *H01L 29/45* | (2006.01) |
| *H01L 21/768* | (2006.01) |
| *H01L 21/3205* | (2006.01) |

(52) U.S. Cl.
CPC .. *H01L 21/32053* (2013.01); *H01L 21/76224* (2013.01); *H01L 21/76802* (2013.01); *H01L 21/76877* (2013.01); *H01L 21/823412* (2013.01); *H01L 21/823431* (2013.01); *H01L 21/823437* (2013.01); *H01L 21/823475* (2013.01); *H01L 21/823481* (2013.01); *H01L 29/0649* (2013.01); *H01L 29/0657* (2013.01); *H01L 29/0847* (2013.01); *H01L 29/34* (2013.01); *H01L 29/45* (2013.01); *H01L 29/66545* (2013.01); *H01L 29/66636* (2013.01)

(56) References Cited

U.S. PATENT DOCUMENTS

| | | | |
|---|---|---|---|
| 6,878,575 | B2 | 4/2005 | Yoo et al. |
| 6,902,814 | B2 | 6/2005 | Takahashi et al. |
| 7,632,739 | B2 | 12/2009 | Hebras |
| 8,076,242 | B2 | 12/2011 | Kim et al. |
| 8,148,629 | B2 | 4/2012 | Chan et al. |
| 2004/0099903 | A1 | 5/2004 | Yeo et al. |
| 2007/0231488 | A1 | 10/2007 | Hans |
| 2008/0182419 | A1 | 7/2008 | Yasui et al. |
| 2008/0258133 | A1 | 10/2008 | Seong |
| 2009/0278224 | A1 | 11/2009 | Kim et al. |
| 2010/0055400 | A1 | 3/2010 | Farr et al. |
| 2011/0198756 | A1 | 8/2011 | Thenappan et al. |
| 2013/0102119 | A1 | 4/2013 | Cheng et al. |
| 2014/0097506 | A1* | 4/2014 | Liaw ................ H01L 29/66795 257/410 |
| 2014/0273380 | A1 | 9/2014 | Liu et al. |

FOREIGN PATENT DOCUMENTS

| | | |
|---|---|---|
| KR | 10-0683490 B1 | 2/2007 |
| KR | 10-0752381 | 8/2007 |
| KR | 10-0825011 | 4/2008 |
| KR | 10-2011-0075992 | 7/2011 |
| KR | 10-1210515 | 12/2012 |

* cited by examiner

METHOD OF MANUFACTURING SEMICONDUCTOR DEVICE USING SURFACE TREATMENT AND SEMICONDUCTOR DEVICE MANUFACTURED BY THE METHOD

CROSS-REFERENCE TO RELATED APPLICATIONS

This U.S. non-provisional patent application is a continuation application of U.S. application Ser. No. 14/543,820, filed on Nov. 17, 2014, which claims priority under 35 U.S.C. § 119 to Korean Patent Application No. 10-2013-0144680, filed on Nov. 26, 2013 in the Korean Intellectual Property Office (KIPO), the contents of each of which are herein incorporated by reference in their entirety.

BACKGROUND

According to miniaturization of a semiconductor device having an active region of a MOS transistor, the size of the active region of the MOS transistor has been gradually reduced. Thereby, the channel length of the MOS transistor also has been reduced. If the channel length of the MOS transistor becomes smaller, a short channel effect (SCE) may occur and the operating performance of the MOS transistor may suffer.

Therefore, various studies have been conducted to increase the operating performance of the MOS transistor even though the size of the active region of the MOS transistor has been reduced. One of them is to use a fin field effect transistor (FinFET) having a fin-type active region. Generally, the fin-type active region may be formed on a substrate of the semiconductor device by partially etching the substrate using an etch process. As a result, the substrate may be damaged by the etch process and the surface roughness of the substrate may increase. If the surface roughness is not cured, the operating performance of the MOS transistor suffer.

SUMMARY

An aspect of the present inventive concepts provides a method of manufacturing a semiconductor device using a surface treatment and a semiconductor device manufactured by the method. According to certain embodiments, the method may include performing a surface treatment on a substrate of the semiconductor device.

In one example embodiment, the method may include providing a substrate having an upper surface, the upper surface having a root-mean-square average roughness, and performing a surface treatment on the upper surface of the substrate using a plasma gas containing at least one of an inert gas and a hydrogen gas to reduce the root-mean-square average roughness. The surface treatment may be performed at a temperature of less than or equal to about 700° C.

The root-mean-square average roughness of the substrate may be less than or equal to about 2 nm after the surface treatment process.

The surface treatment may be performed at a pressure of less than or equal to about 999 Torr and a power of about 1 kW to about 5 kW.

The plasma gas may be generated by using at least one of a direct plasma, a remote plasma, a radiofrequency plasma, a microwave plasma, an inductively coupled plasma, a capacitively coupled plasma, and an electron cyclotron resonance plasma.

The inert gas may include at least one of helium (He), neon (Ne), argon (Ar), krypton (Kr), xenon (Xe), and radon (Rn).

The substrate may further include a fin protruding from the upper surface of the substrate. The fin may have a top and a sidewall. The top surface and the sidewall of the fin may have a surface roughness. The sidewall of the fin may have an inclined shape before the surface treatment and may be transformed to be substantially perpendicular to the upper surface of the fin after the surface treatment.

The method of performing the surface treatment may include performing a first surface treatment sub-process to reduce the surface roughness of the fin, and performing a second surface treatment sub-process to transform the sidewall of the fin to be substantially perpendicular to the upper surface of the fin.

The first surface treatment sub-process may be performed using a helium gas plasma at a pressure of about 5 Torr to about 25 Torr, a power of about 2 kW to about 4 kW, and a temperature of about 300° C. to about 500° C.

The second surface treatment sub-process may be performed using a hydrogen gas plasma at a pressure of less than or equal to about 1 Torr, a plasma power of about 2 kW to about 4 kW, and a temperature of about 300° C. to about 500° C.

In another example embodiment of the inventive concepts, a method of manufacturing a semiconductor device may include forming a plurality of trenches and a plurality of protruding portions in a substrate, each protruding portion disposed between two trenches, including a top surface and at least two sidewalls each extending to the top surface, and comprising an active region; forming a device isolation layer in the plurality of trenches, the device isolation layer exposing the top surfaces of the plurality of protruding portions and upper portions of the sidewalls of the plurality of protruding portions; and performing a first plasma treatment process on the exposed surfaces of the protruding portions. The first plasma treatment process may be performed using a plasma gas containing at least one of an inert gas and a hydrogen gas at a temperature of less than or equal to about 700° C.

The method may further include performing a second plasma treatment process on a surface of the first plurality of trenches in the substrate before forming the device isolation layer.

Each protruding portion may be a fin-type active region.

The method may further include performing a cleaning process on the surface of the fin-type active regions, and forming a gate dielectric layer on the surface of the fin-type active regions.

The method may further include forming a first gate dielectric layer on the surface of a first fin-type active region of the fin-type active regions, forming a first gate electrode pattern having an upper surface and a sidewall on the gate dielectric layer, the first gate electrode pattern crossing the first fin-type active region and partially covering the upper surface and sidewall of the first fin-type active region, forming a plurality of recessed regions by partially etching a portion of each of the fin-type active regions and portions of the substrate adjacent to each of those portions, and forming a source/drain epitaxial layer in the plurality of recessed regions.

The method may further include performing a second plasma treatment process on a surface of the second plurality of recessed regions before forming the source/drain epitaxial layer.

The method may further include forming an interlayer insulating layer on the source/drain epitaxial layer, the interlayer insulating layer covering a sidewall of the first gate electrode pattern but not covering the upper surface of the first gate electrode pattern, exposing the upper surface and the sidewall of the fin-type active region by removing the first gate electrode pattern and the first gate dielectric layer, performing a plasma treatment on the upper surface and the sidewall of the fin-type active region, forming a second gate dielectric layer on the upper surface and the sidewall of the fin-type active region, and forming a second gate electrode pattern including metal on the second gate dielectric layer.

The method may further include forming a contact hole passing through the interlayer dielectric layer to expose the source/drain epitaxial layer, forming a metal silicide layer at the bottom of the contact hole, and forming a plug filling the contact hole on the metal silicide layer.

The substrate may include a low-voltage transistor region and a high-voltage transistor region, wherein the fin-type active region may include a first fin formed in the low-voltage transistor region and a second fin formed in the high-voltage transistor region. The method may further include forming a first gate dielectric layer on the first fin and a second gate dielectric layer on the second fin, forming a sacrificial layer pattern having an upper surface and a sidewall on the first and the second gate dielectric layer, forming an interlayer dielectric layer exposing the upper surface of the sacrificial layer pattern on the sidewall of the sacrificial layer pattern, removing the sacrificial layer pattern to expose the first and the second gate dielectric layer, removing the first gate dielectric layer to expose the first fin, performing a second plasma treatment process on the first fin, forming a high-k dielectric layer on the first fin, and forming a gate electrode layer on the high-k dielectric layer.

The first plasma treatment may be performed in a pressure of less than or equal to about 999 Torr and a power of about 1 kW to about 5 kW.

In one embodiment, the first plasma treatment process includes a first sub-process for reducing the roughness of the exposed surfaces of the protruding portions and performed at a pressure between about 5 Torr and 25 Torr and using a plasma gas including an inert gas, and a second sub-process for changing the angle between the sidewalls of the protruding portion and a top surface of the device isolation layer and performed at a pressure less than about 1 Torr and using a plasma gas including hydrogen.

The plasma gas may be generated by using at least one of a direct plasma, a remote plasma, a radiofrequency plasma, a microwave plasma, an inductively coupled plasma, a capacitively coupled plasma, and an electron cyclotron resonance plasma.

The inert gas may include at least one of helium (He), neon (Ne), argon (Ar), krypton (Kr), xenon (Xe), and radon (Rn).

In yet another embodiment, a method of manufacturing a semiconductor device includes providing a substrate; etching the substrate to form a plurality of trenches, each trench having two opposite sidewall surfaces and an upper surface at the bottom of the trench; performing a first plasma treatment process in the trenches to reduce a surface roughness of the surfaces of the trenches; forming a device isolation layer that covers the upper surfaces at the bottom of the trenches and a lower portion of the sidewall surfaces of the trenches; performing a second plasma treatment process on fin portions of the substrate, each fin portion including an exposed top surface of the substrate and opposite exposed sidewall surfaces at upper portions of the sidewall surfaces of the trenches, to reduce a surface roughness of these surfaces; forming a first gate dielectric layer on a surface of a first fin portion of the substrate; and forming a first gate electrode pattern having an upper surface and a sidewall on the first gate dielectric layer, the first gate electrode pattern crossing the first fin portion and partially covering the top surface and sidewalls of the first fin portion.

The method may additionally include forming recessed regions on either side of the first gate electrode pattern by etching part of the first fin portion; and forming a source/drain epitaxial layer in each recessed region.

The method may also include prior to forming the source/drain epitaxial layer in each recessed region, performing a third plasma treatment process to reduce surface roughness of the recessed regions on either side of the first gate electrode pattern.

In one embodiment, as a result of the first, second, and third plasma treatment processes, each respective substrate surface on which the plasma treatment process was performed has a root-mean-square average roughness of about 2 nm or less.

In one embodiment, each of the first, second, and third plasma treatment processes include using a plasma gas containing at least one of an inert gas and a hydrogen gas at a temperature of less than or equal to about 700° C.

Further, at least one of the first, second, or third plasma treatment processes may include a first and second subprocess, the first subprocess using a first gas and performed at a first pressure, and the second subprocess using a second, different gas and performed at a second pressure at least five times smaller than the first pressure.

The first gas may be an inert gas and the second gas may be hydrogen.

In still another example embodiment of the inventive concepts, a semiconductor device may include a substrate including a high-voltage transistor region and a low-voltage transistor region, a first gate dielectric layer on the substrate in the high-voltage transistor region, a first gate electrode pattern on the first gate dielectric layer, a second gate dielectric layer on the substrate in the low-voltage transistor region, a second gate electrode pattern on the second gate dielectric layer, a first root-mean-square average roughness of the substrate adjoining the first gate dielectric layer, and a second root-mean-square average roughness of the substrate adjoining the second gate dielectric layer. The second root-mean-square average roughness may be less than the first root-mean-square average roughness.

The first and the second root-mean-square average roughness may be less than about 2 nm.

The semiconductor device may further include a first fin protruding from the substrate in the high-voltage transistor region, the first fin having a first upper surface and a first sidewall, a second fin protruding from the substrate in the low-voltage transistor region, the second fin having a second upper surface and a second sidewall. The first gate dielectric layer may adjoin the first upper surface and the first sidewall. The second gate dielectric layer may adjoin the second upper surface and the second sidewall. The first upper surface and the first sidewall may have a first surface roughness and the second upper surface and the second sidewall may have a second surface roughness less than the first surface roughness.

The semiconductor device may further include a device isolation film adjoining lower sidewalls of the first and second fins. The first and the second root-mean-square average roughness of the first and second fins adjoining the device isolation film may be less than about 2 nm, respectively.

The semiconductor device may further include a first source/drain epitaxial layer on the first fin adjacent the first gate electrode pattern and a second source/drain epitaxial layer on the second fin adjacent the second gate electrode pattern.

In still another example embodiment of the inventive concepts, a semiconductor device may include a fin protruding from a substrate, the fin having an upper surface, a lower sidewall, and an upper sidewall, a device isolation film on the substrate, the device isolation film having an upper surface and covering the lower sidewall of the fin, and an inner angle formed between the upper sidewall and the lower sidewall of the fin. The inner angle may be greater than 180°.

The semiconductor device may further include a first width at the upper surface of the fin, and a second width at a middle portion of the fin, the middle portion of the fin having substantially the same level as the upper surface of the device isolation film. The first width may be substantially the same as the second width.

The semiconductor device may further include a first width at a bottom of the fin, and a second width at a middle portion of the fin, the middle portion of the fin having substantially the same level as the upper surface of the device isolation film. The second width may be less than the first width.

BRIEF DESCRIPTION OF THE DRAWINGS

The foregoing and other features and advantages described herein will be apparent from the more particular description of the example embodiments, as illustrated in the accompanying drawings in which like reference characters refer to the same or similar parts throughout the different views. The drawings are not necessarily to scale, emphasis instead being placed upon illustrating the principles of the inventive concepts.

FIGS. 5a through 16a are cross-sectional views illustrating an exemplary method of manufacturing a semiconductor device corresponding to FIG. 4a.

FIGS. 5b through 16b are cross-sectional views illustrating an exemplary method of manufacturing a semiconductor device corresponding to FIG. 4b.

FIGS. 5c through 16c are cross-sectional views illustrating an exemplary method of manufacturing a semiconductor device corresponding to FIG. 4c.

FIGS. 18a through 21a are cross-sectional views illustrating an exemplary method of manufacturing a semiconductor device corresponding to FIG. 17a.

FIGS. 18b through 21b are cross-sectional views illustrating an exemplary method of manufacturing a semiconductor device corresponding to FIG. 17b.

FIGS. 18c through 21c are cross-sectional views illustrating an exemplary method of manufacturing a semiconductor device corresponding to FIG. 17c.

DETAILED DESCRIPTION OF EXAMPLE EMBODIMENTS

Figure 1A:
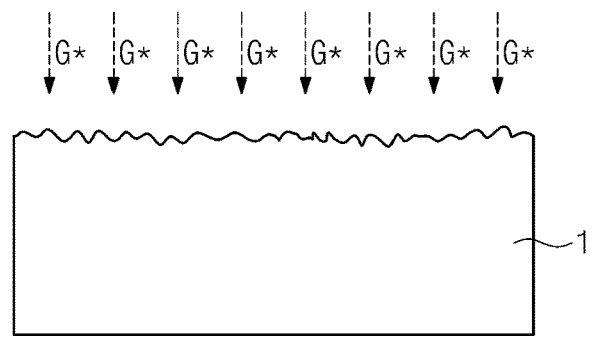
FIGS. 1a and 1b are cross-sectional views illustrating a method of performing a surface treatment according to an example embodiment of the inventive concepts.

Example embodiments of the inventive concept will now be described more fully hereinafter with reference to the accompanying drawings; however, they may be embodied in different forms and should not be construed as limited to the example embodiments set forth herein.

In the drawing figures, the dimensions of layers and regions may be exaggerated for clarity of illustration.

As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, or "contacting" another element, there are no intervening elements present. Other words used to describe the relationship between elements or layers should be interpreted in a like fashion (e.g., "on" versus "directly on," "under" versus "directly under," "between" versus "directly between," "adjacent" versus "directly adjacent").

It will be understood that, although the terms "first", "second", etc., may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section. Thus, a first element, component, region, layer or section discussed below could be termed a second element, component, region, layer or section without departing from the teachings of example embodiments. Similarly, a process that occurs first in time may be referred to herein as a "second" process, and a process that occurs later in time may be referred to as a "first" process. As such, to reiterate, unless the context gives a certain order-related, temporal-related, or other contextual-based meaning to terms such as "first" and "second," these terms are used merely as a naming convention.

Spatially relative terms, e.g., "beneath," "below," "lower," "above," "upper" and the like, may be used herein for ease of description to describe the relationship of one element or feature to another element(s) or feature(s), as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to") unless otherwise noted.

Unless defined otherwise, all technical and scientific terms used herein have the same meaning as commonly understood by one of ordinary skill in the art. It is noted that the use of any and all examples, or exemplary terms provided herein is intended merely to better illuminate the example embodiments and is not a limitation on the scope of the inventive concepts unless otherwise specified.

Example embodiments will be described with reference to perspective views, cross-sectional views, and/or plan views. The profile of an example view may be modified according to, e.g., manufacturing techniques and/or allowances. Accordingly, the example embodiments are not intended to limit the scope, but cover all changes and modifications that can be caused due to, e.g., a change in manufacturing process. Thus, regions shown in the drawings are illustrated in schematic form and the shapes of the region are presented simply by way of illustration and not as a limitation.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" or "about" may be used herein to reflect this meaning.

Hereinafter, example embodiments of the inventive concepts will be described in detail with reference to the accompanying drawings.

Figure 1B:
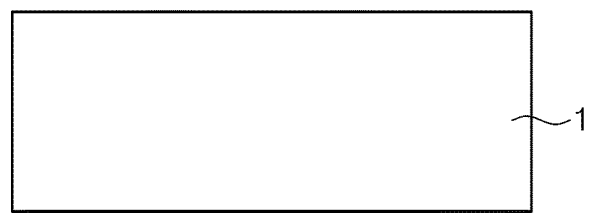

FIGS. 1a and 1b are cross-sectional views illustrating a method of performing a surface treatment according to an example embodiment of the inventive concepts.

Referring to FIGS. 1a and 1b, a substrate 1 may be provided in a chamber of an apparatus which can generate plasma. The substrate 1 may include, for example, at least one element of group III-V semiconductors. For example, the substrate 1 having an upper surface may comprise a silicon substrate, a germanium substrate, and/or a silicon germanium substrate. The upper surface of the substrate 1 may be damaged by an etch process and therefore the upper surface of the substrate 1 may become uneven and have a surface roughness.

A surface treatment may be performed on the upper surface of the substrate 1, for example using a plasma gas (G*) containing at least one of an inert gas and a hydrogen gas. The inert gas may include at least one of helium (He), neon (Ne), argon (Ar), krypton (Kr), xenon (Xe), and radon (Rn). In one embodiment, the surface treatment may be performed in a pressure of less than or equal to about 999 Torr. In one embodiment, the plasma gas may be generated in a power range of about 1 kW to about 5 kW, more specifically, about 2 kW to about 4 kW. The plasma gas may be generated by using at least one of a direct plasma, a remote plasma, a radiofrequency plasma, a microwave plasma, an inductively coupled plasma, a capacitively coupled plasma, and an electron cyclotron resonance plasma. The surface treatment may be performed in a time of about 10 seconds to about 999 seconds, and at a lower temperature of less than or equal to about 700° C., specifically about 300° C. to about 500° C.

If the surface treatment is performed at the lower temperature mentioned above, a thermal energy generated by the plasma gas may be delivered to only the surface of the substrate 1 and an Ostwald ripening phenomenon may be observed at the surface of the substrate 1. For example, the substrate 1 may have many small protrusions which protrude from the substrate 1 due to the surface roughness and the small protrusions may disappear or have reduced size after the surface treatment. Specifically, the Ostwald ripening phenomenon may occur due to the difference in surface energies between the small protrusions and the substrate 1 at the same temperature. Therefore, the surface roughness of the substrate 1 may be reduced and the substrate 1 may be planarized as shown in FIG. 1b. The root-mean-square average roughness (Rq) of the substrate may be less than or equal to about 2 nm after the surface treatment. This Rq may be determined based on values taken from individual peak heights and depths from the arithmetic mean elevation of the surface. In certain embodiments, the surface treatment may be performed at a pressure of about 5 Torr to about 25 Torr. The surface roughness of the substrate 1 may be more effectively improved by using helium (He) gas among the above mentioned inert gases.

On the other hand, if the surface treatment is performed at a temperature of higher than 700° C., an excessive thermal energy may be delivered to the chemical bonds of the silicon molecules in the substrate 1 and the upper surface of the substrate 1 may be excessively deformed and some of the small protrusions may be bridged to connect to each other.

Figure 2A:
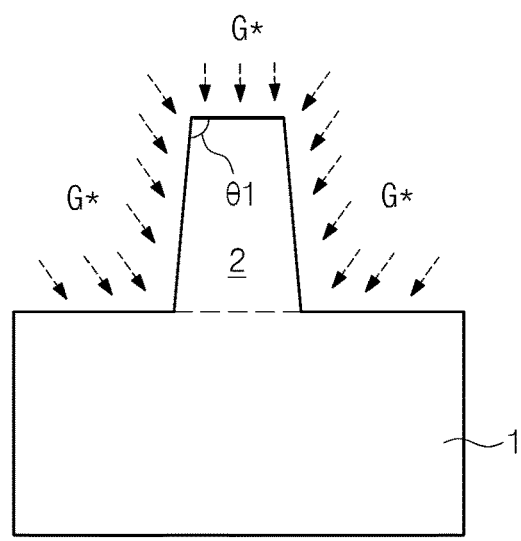
FIGS. 2a and 2b are cross-sectional views illustrating a method of performing a surface treatment according to another example embodiment of the inventive concepts.
Figure 2B:
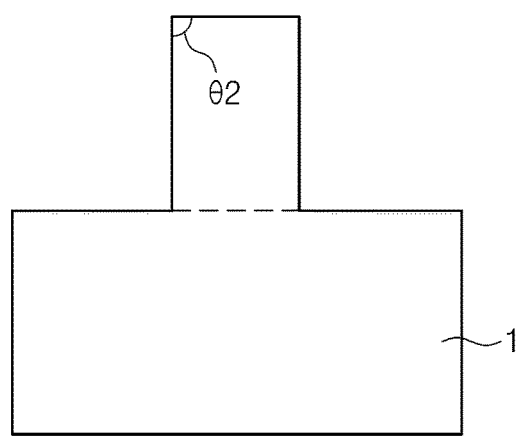

FIGS. 2a and 2b are cross-sectional views illustrating a method of performing a surface treatment according to another example embodiment of the inventive concepts.

Referring to FIGS. 2a and 2b, a fin 2 protruding from the substrate 1 may be formed on the substrate 1. The fin 2, having an upper surface and a sidewall, may be formed by partially etching a portion of the substrate 1. As a result, a width at the upper surface of the fin 2 may be less than or equal to 10 nm (e.g., a width in a horizontal direction as shown in FIG. 2A). The sidewall of the fin 2 may be inclined, i.e., a first angle $\theta 1$ formed between the upper surface and the sidewall of the fin 2 may be greater than 90°. The sidewall of the fin 2 may be damaged and have a surface roughness like the upper surface of the substrate 1 as shown in FIG. 1a. A surface treatment may be performed on the upper surface and the sidewall of the fin 2. As a result, the surface roughness of the upper surface and the sidewall of the fin 2 may be reduced by the Ostwald ripening phenomenon as shown in FIG. 2b. Additionally, the first angle $\theta 1$ may be changed to a second angle $\theta 2$ after the surface treatment. The second angle $\theta 2$ may be substantially 90°. Thereby, a first, a second, and a third width of the fin 2 at an upper portion, a middle portion, and a bottom portion of the fin 2, respectively, may be substantially the same as each other. If the first angle $\theta 1$ is changed to substantially 90°, the controllability of the channel in fin 2 may be improved.

Process conditions of performing the surface treatment on the fin 2 may be the same as the process conditions mentioned above referring to FIGS. 1a and 1b. For example, the surface treatment may be performed at a temperature less than or equal to about 700° C., specifically about 300° C. to about 500° C. The surface treatment may be performed at a pressure of less than or equal to about 999 Torr, in one embodiment specifically less than or equal to about 1 Torr. The plasma may be generated in a power range of about 1 kW to about 5 kW, specifically about 2 kW to about 4 kW. The surface roughness of the fin 2 may be reduced by using a plasma gas containing at least one of an inert gas and a hydrogen gas. The surface roughness of the fin 2 may be more effectively improved by using helium (He) gas among the above mentioned inert gases.

As mentioned above, the surface roughness of the substrate 1 may be reduced and the shape of the fin 2 may also be changed to a better shape by performing the surface treatment. If the width of the fin 2 is less than 10 nm, the change of the shape may be a very important factor to increase the device performance.

Figure 3:
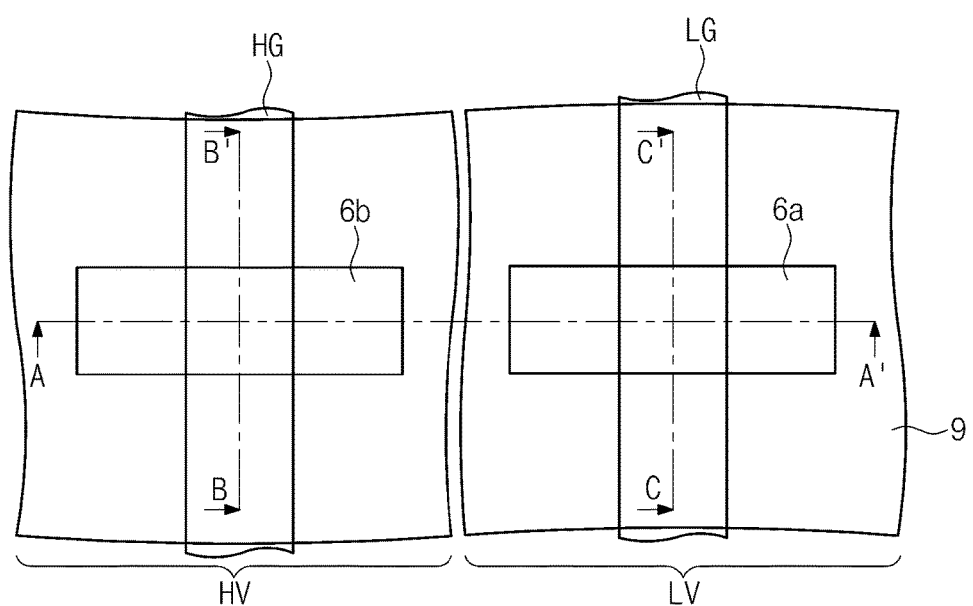
FIG. 3 is a layout of a semiconductor device according to an example embodiment of the inventive concepts.
Figure 4A:
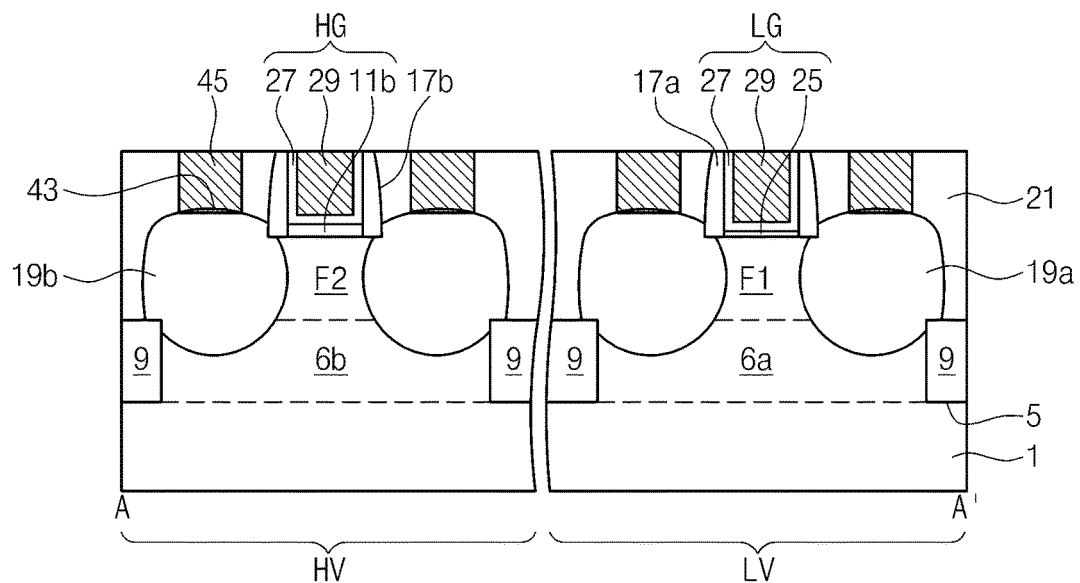
FIGS. 4a through 4c are cross-sectional views illustrating a semiconductor device according to an example embodiment of the inventive concepts corresponding to lines A-A', B-B', and C-C' of FIG. 3.
Figure 4B:
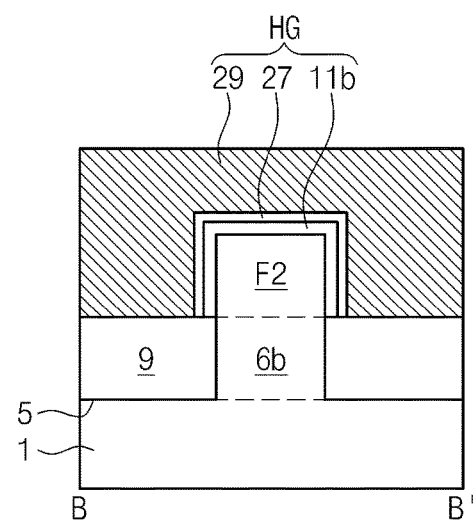
Figure 4C:
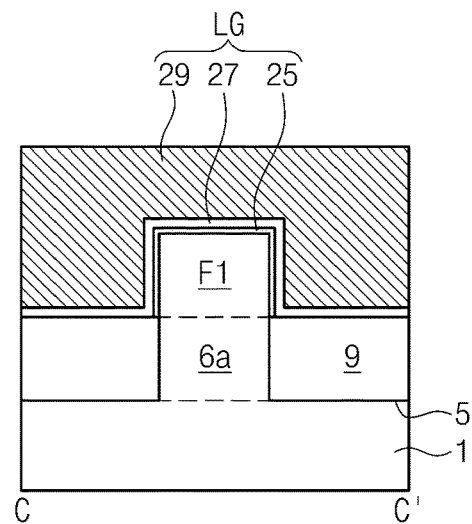
Figure 4D:
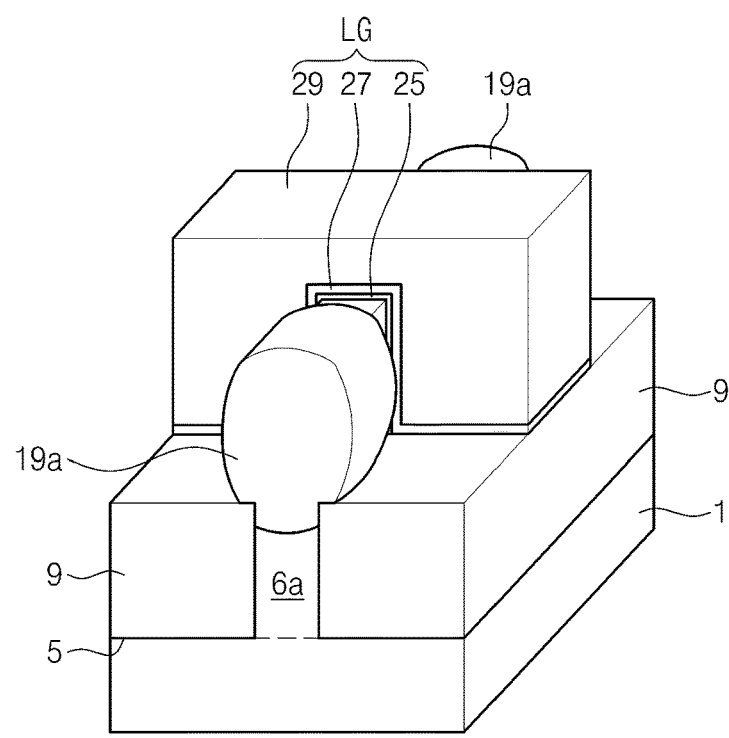
FIG. 4d is a perspective view illustrating an exemplary low-voltage transistor such as shown in FIG. 3.

FIG. 3 is a layout of a semiconductor device according to an example embodiment of the inventive concepts. FIGS. 4a through 4c are cross-sectional views illustrating a semiconductor device according to an example embodiment of the inventive concepts corresponding to lines A-A', B-B', and C-C' of FIG. 3. FIG. 4d is a perspective view illustrating a low-voltage transistor as shown in FIG. 3.

Referring to FIG. 3 and FIGS. 4a through 4d, a trench region 5, also referred to as a recessed region, may be formed in a substrate 1 containing a low-voltage transistor region LV and a high-voltage transistor region HV. The substrate 1 may comprise, for example, a rigid substrate, e.g., a bulk silicon substrate or a silicon-on-insulator (SOI) substrate. A device isolation film 9, more generally referred to as a device isolation layer, may be disposed in the trench region 5. The device isolation film 9 may comprise, for example, a silicon oxide layer. A first active region 6a protruding from the substrate 1 may be disposed between the device isolation films 9 formed in the low-voltage transistor region LV. The upper surface of the first active region 6a may have a level higher than that of the bottom of the device isolation films 9. A second active region 6b protruding from the substrate 1 may be disposed between the device isolation films 9 formed in the high-voltage transistor region HV. The upper surface of the second active region 6b may also have a level higher than that of the bottom of the device isolation films 9. A first fin F1 and a second fin F2 having upper surfaces may be disposed on the first and second active regions 6a and 6b, respectively. The upper surfaces of the first and second fins F1 and F2 may have a level higher than that of the upper surfaces of the first and second device isolation films 9. The first and second active regions 6a and 6b as well as the first and second fins F1 and F2 may be a portion of the substrate 1. In one embodiment, an active region (6a or 6b), or a combined active region and fin (e.g., 6a and F1, or 6b and F2) may be referred to as a protruding region or protruding active region or portion of the substrate 1, and the regions of the substrate 1 covered by device isolation film 9 may be referred to as a non-protruding region or portion of the substrate 1, or a recessed region of the substrate.

A low-voltage gate electrode pattern LG may be formed on the first fin F1. The low-voltage gate electrode pattern LG may cover the upper surface and the sidewall of the first fin F1 and comprise an interface layer 25, a high-k dielectric layer 27, and/or a gate electrode layer 29. The interface layer 25 may include, for example, a silicon oxide layer. The high-k dielectric layer 27 may include, for example, a hafnium oxide layer which has a dielectric constant higher than that of the interfacial layer 25. The gate electrode layer 29 may include, for example, a titanium nitride layer (TiN) and/or a tungsten layer (W). A first source/drain epitaxial layer 19a may be disposed at both sides of the low-voltage gate electrode pattern LG. An upper surface of the first source/drain epitaxial layer 19a may have a level higher than that of a bottom of the low-voltage gate electrode pattern LG. Hereinafter, a second layer on a first layer in which a crystal structure of the first layer is continued in the second layer (e.g., as a result of epitaxial growth) may be referred to as a "continued layer."

A high-voltage gate electrode pattern HG may be formed on the second fin F2. The high-voltage gate electrode pattern HG may cover the upper surface and the sidewall of the second fin F2 and comprise a high-voltage gate dielectric layer 11b, a high-k dielectric layer 27, and/or a gate electrode layer 29. The high-voltage gate dielectric layer 11b may include, for example, a silicon oxide layer. A second source/drain epitaxial layer 19b may be disposed at both sides of the high-voltage gate electrode pattern HG. An upper surface of the second source/drain epitaxial layer 19b may have a level higher than that of a bottom of the high-voltage gate electrode pattern HG.

A first and a second spacer 17a and 17b may be formed at respective sides of the low-voltage and the high-voltage gate electrode pattern LG and HG. An interlayer dielectric layer 21 may be formed on the first and second source/drain epitaxial layers 19a and 19b. A plurality of contact plugs 45 passing through the interlayer dielectric layer 21 may be connected to the first and second source/drain epitaxial layers 19a and 19b. A metal silicide layer 43 may be formed between the plurality of contact plugs 45 and the first and second source/drain epitaxial layers 19a and 19b, respectively.

In one embodiment, the root-mean-square average roughnesses (Rq) of the bottom and the sidewall of the trench 5, the upper surface of the substrate 1 (e.g., at the bottom of the trench and/or at an upper sidewall surface), and/or the top surfaces and the sidewalls of the first and second fins F1 and F2 may be less than or equal to 2 nm. A first surface roughness of the top surface of the first fin F1 may be less than that of the top surface of the second fin F2. Angles between the upper surface and either sidewall of the first and the second fin F1 and F2 may be substantially 90°. An angle between the bottom and the sidewall of the device isolation film may also be substantially 90°.

In one embodiment, where a width of a top surface of a fin, such as fin F1 or F2 is about 10 nm, then a root-mean-square average roughness (Rq) of one or more of the bottom and the sidewall of the trench 5, the upper sidewall surface of the substrate 1, and the top surface and the sidewalls of the first and second fins F1 and F2 may be less than or equal to 20% of the width of the fin.

FIGS. 5a through 16a are cross-sectional views corresponding to FIG. 4a illustrating an exemplary method of manufacturing a semiconductor device. FIGS. 5b through 16b are cross-sectional views corresponding to FIG. 4b illustrating an exemplary method of manufacturing a semiconductor device. FIGS. 5c through 16c are cross-sectional views corresponding to FIG. 4c illustrating an exemplary method of manufacturing a semiconductor device.

Figure 5A:
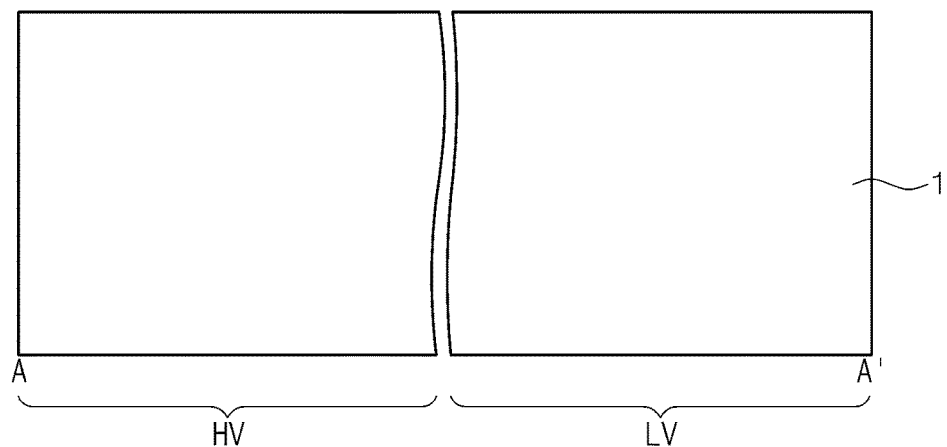
Figure 5B:
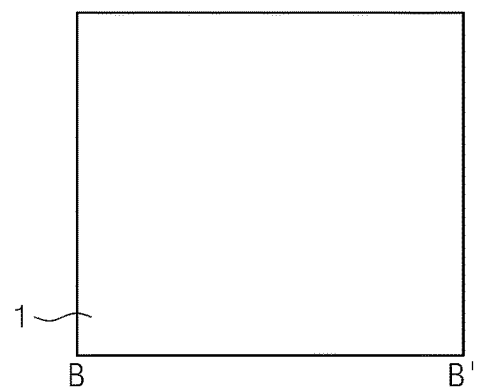
Figure 5C:
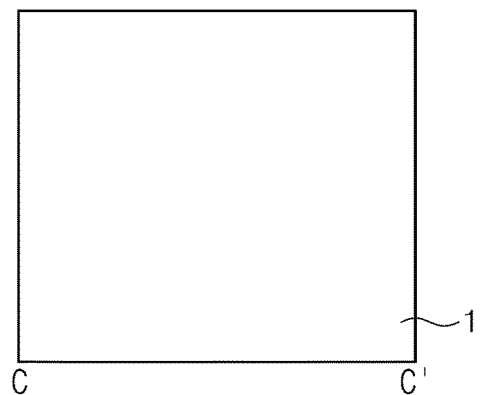

Referring to FIGS. 5a through 5c, a substrate 1 having a low-voltage transistor region LV and a high-voltage transistor region HV is provided. The substrate 1 may include at least one element of group III-V semiconductors. The substrate 1 having an upper surface may comprise, for example, a silicon substrate, a germanium substrate, and/or a silicon germanium substrate.

Figure 6A:
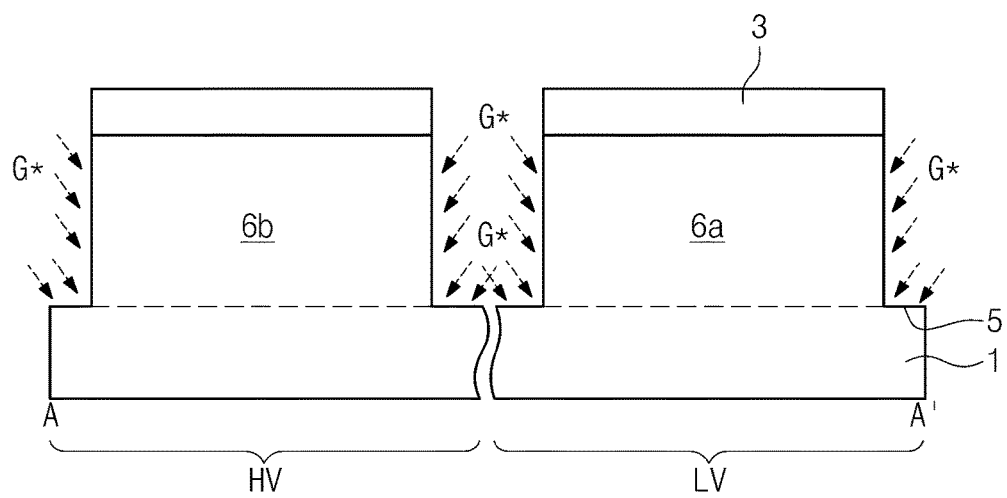
Figure 6B:
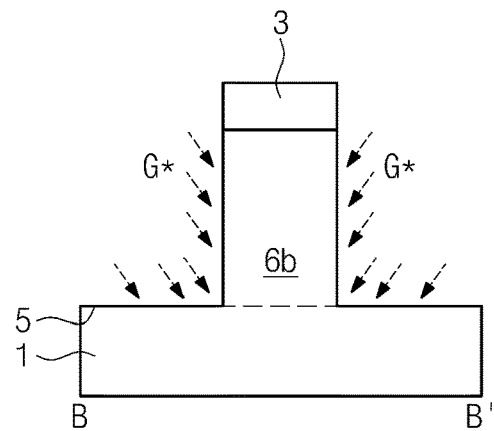
Figure 6C:
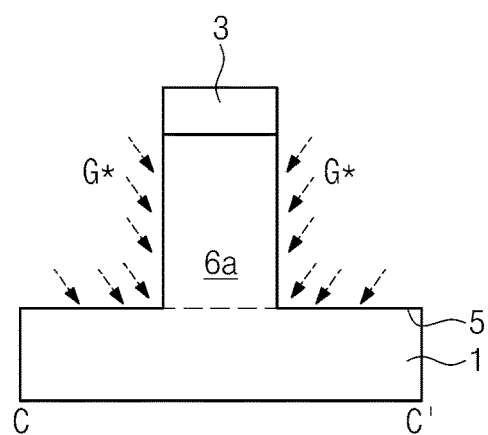

Referring to FIGS. 6a through 6c, a first mask pattern 3 defining a first active region 6a in the low-voltage transistor region LV and a second active region 6b in the high-voltage transistor region HV are formed on the substrate 1. The substrate 1 may be partially etched by an etch process using the first mask pattern 3 as an etch mask to form a trench 5, the first active region 6a, and the second active region 6b. The surfaces at the bottom and the sidewalls of the trench 5 may be damaged and roughened by the etch process. If a device isolation film 9 is formed in the trench 5 having the damaged and roughened surface of the trench 5, it may cause some malfunctioning of the semiconductor device. Therefore, a surface treatment may be performed to the surfaces at the bottom and the sidewalls of the trench 5 (e.g. to an upper surface of the substrate 1 in the trench 5 and to sidewall surfaces of the substrate 1 that form the trench) in order to cure the damaged and roughened surfaces.

In certain embodiments, the surface treatment may be performed on the surfaces at the bottom and the sidewalls of the trench 5 by the same method mentioned above referring to FIGS. 1a and 2a. For example, the surface treatment may be performed using a plasma gas containing at least one of an inert gas and a hydrogen gas at a temperature of less than or equal to about 700° C. in order to reduce a root-mean-square average roughness (Rq) of the surfaces at the bottom and the sidewalls of the trench 5. The root-mean-square average roughness (Rq) of the bottom and the sidewall surfaces of the trench 5 may become less than or equal to 2 nm. The sidewalls of the trench 5 may be inclined after the etch process. For example, opposing sidewalls of the trench may lean away from each other, thereby each having an angle greater than 90° with respect to the bottom surface of the trench. However, the angle between the bottom and each sidewall of the trench 5 may be changed by the surface treatment to be substantially 90°. Specifically, the surface treatment for the trench may be performed by two separate processes of a first and a second surface treatment. The first surface treatment may be performed in order to cure the damaged surface and the second surface treatment may be performed in order to change the shape of the inclined sidewalls of the trench 5. In one embodiment, the first surface treatment may be performed using a helium plasma gas in a pressure of about 5 Torr to about 25 Torr, a power of about 2 kW to about 4 kW, and a temperature of about 300° C. to about 500° C. The second surface treatment may be performed using a hydrogen plasma gas in a pressure of less than about 1 Torr, a power of about 2 kW to about 4 kW, and a temperature of about 300° C. to about 500° C. As such, the second surface treatment may be performed at a pressure at least five times smaller than the pressure at which the first surface treatment is performed.

In certain embodiments, the use of hydrogen plasma gas in the second surface treatment, as opposed to helium plasma gas, decreases an activation energy such as a surface energy of the substrate, which results in a structure having the substantially 90° sidewalls rather than inclined sidewalls, such as described above. Also, by reducing the pressure during the second surface treatment, for example, to less than 1 Torr as opposed to about 5 Torr to about 25 Torr, a further decrease in the surface energy of the substrate can be achieved. This decrease in pressure is particularly effective when using the hydrogen plasma gas (e.g., by increasing a density of hydrogen radicals used in the hydrogen plasma).

In particular, extensive experimentations were carried out to test for optimal conditions for forming fin surfaces having desired characteristics. For example, a desirable thermal range was tested, and it was discovered that at a temperature above 500° C., a strain of semiconductor materials, such as SiGe, Ge, etc., in a channel of a fin can be loose, and excessive chemical reactions can occur. Further, various pressure ranges were tested, and it was found that between about 5 Torr and about 25 Torr, low density plasma can be formed, which is advantageous to reduce a surface roughness of a fin without changing a structure of the fin. However, at a pressure below 1 Torr, a high density plasma can be formed, which is more effective in changing a structure of a fin. Upon further testing, with regard to the power range, a power range 2 kW to 4 kW was found to be desirable because under 2 kW, a plasma was not effectively formed, and above 4 kW resulted in highly energetic ions, which can cause undesirable $SiO_x$ to form on the substrate.

Throughout this specification, the combination of two or more surface treatments may be referred to as a surface treatment process, and each individual treatment or groups of individual treatments that together make up a surface treatment process may be referred to as surface treatment sub-processes (e.g., a first surface treatment sub-process, a second surface treatment sub-process, etc.). However, the term "treatment process," may generally refer to any of these processes or sub-processes. Also, the term plasma treatment or plasma surface treatment may further describe the disclosed surface treatments.

Figure 7A:
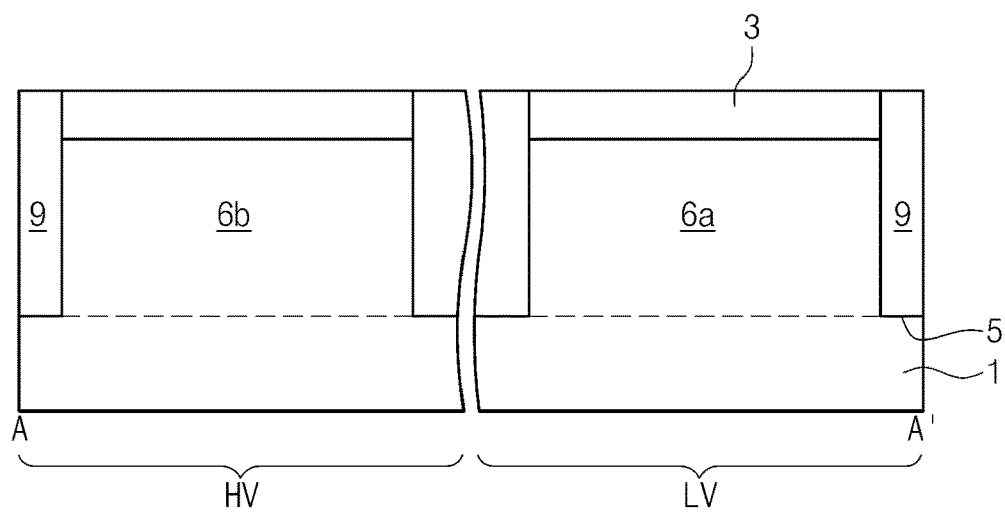
Figure 7B:
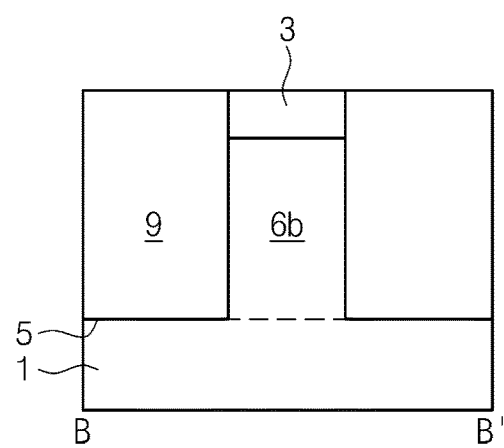
Figure 7C:
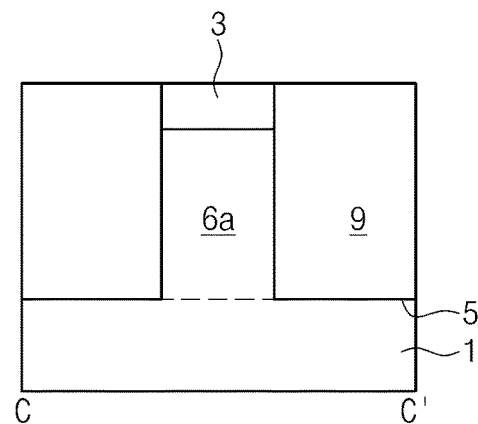

Referring to FIGS. 7a through 7c, a device isolation film 9 is formed in the trench 5. The device isolation film 9 may be formed, for example, by a chemical vapor deposition (CVD) process, and planarized using an etch-back process in order to expose the upper surface of the first mask pattern 3.

Figure 8A:
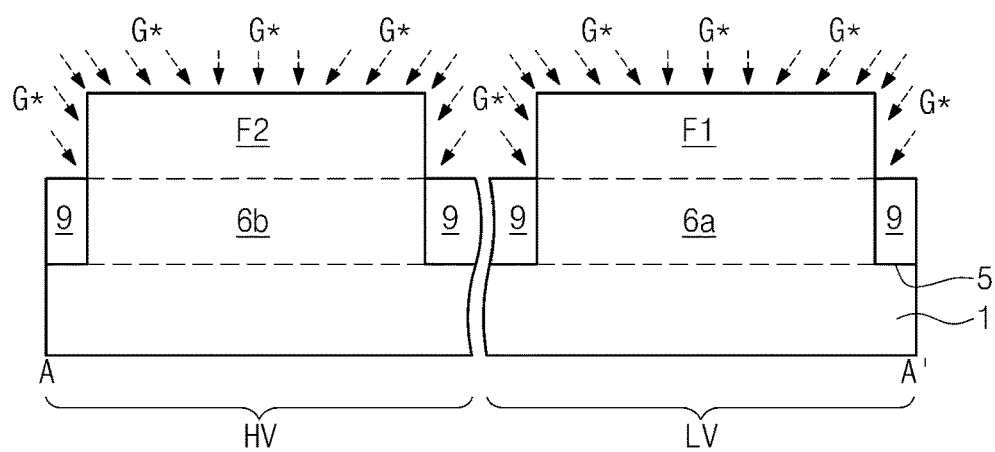
Figure 8B:
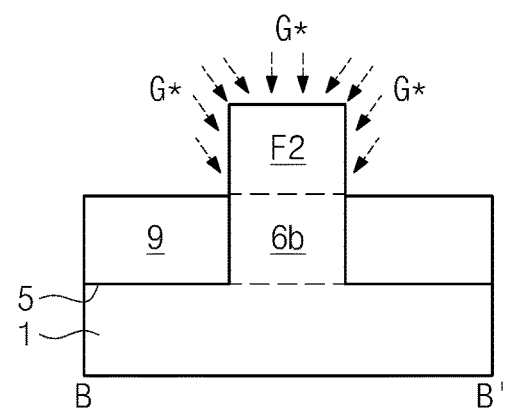
Figure 8C:
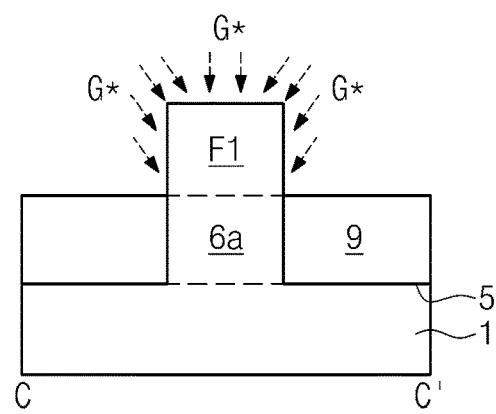

Referring to FIGS. 8a through 8c, the etch-back process may be continued to expose an upper portion of the sidewalls of the first and second active regions 6a and 6b. Thereby, the device isolation film 9, covering a lower portion of the sidewalls of the first and second active regions 6a and 6b, may remain in the trench 5. A first and a second fin F1 and F2, having an upper surface higher than the upper surface of the device isolation film 9, may be formed at the upper portion of the first and second active regions 6a and 6b. The first mask pattern 3 may be removed. The upper surfaces and the sidewalls of the first and second fins F1 and F2 may be damaged and roughened by the etch-back process. The roughness of the first and second fins F1 and F2 may be a very important factor negatively affecting the transistor performance due to miniaturization of the semiconductor device. Therefore, another surface treatment may be performed on the exposed surfaces of the first and second fins F1 and F2, for example, using substantially the same method mentioned above referring to FIGS. 1a and 2a. For example, the surface treatment may be performed using a plasma gas containing at least one of an inert gas and a hydrogen gas in a temperature of less than or equal to about 700° C. in order to reduce a root-mean-square average roughness (Rq) of the surfaces of the first and second fins F1 and F2. The root-mean-square average roughness (Rq) of the surfaces of the first and second fins F1 and F2 may become less than or equal to about 2 nm. The sidewalls of the first and second fins F1 and F2 may be inclined after the etch process. For example, the two opposing sidewalls may lean toward each other, such that an angle between each sidewall and a top surface of the adjacent device isolation film is greater than 90°. However, the angle between each sidewall of the first and second fins F1 and F2 and the top surface of its adjacent device isolation film may be changed to substantially 90° by the surface treatment. Specifically, the surface treatment may include a surface treatment process performed by two separate surface treatment sub-processes of a first and a second surface treatment. The first surface treatment may be performed in order to cure the damaged surface and the second surface treatment may be performed in order to change the inclined shape of each sidewall of the first and second fins F1 and F2. In one embodiment, the first surface treatment may be performed using a helium plasma gas at a pressure of about 5 Torr to about 25 Torr, a power of about 2 kW to about 4 kW, and a temperature of about 300° C. to about 500° C. The second surface treatment may be performed using a hydrogen plasma gas at a pressure of less than about 1 Torr, a power of about 2 kW to about 4 kW, and a temperature of about 300° C. to about 500° C.

Figure 9A:
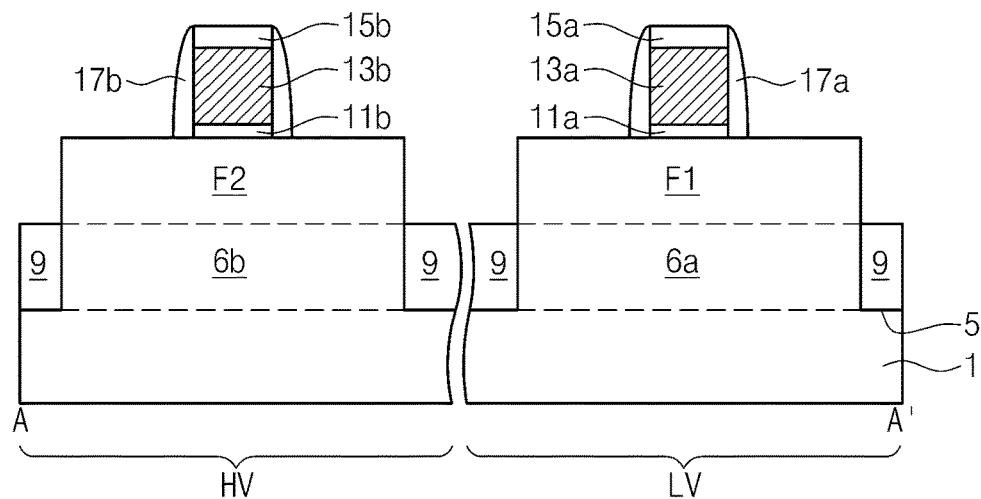
Figure 9B:
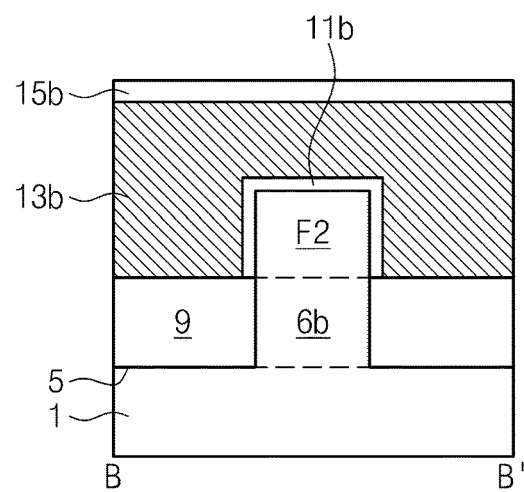
Figure 9C:
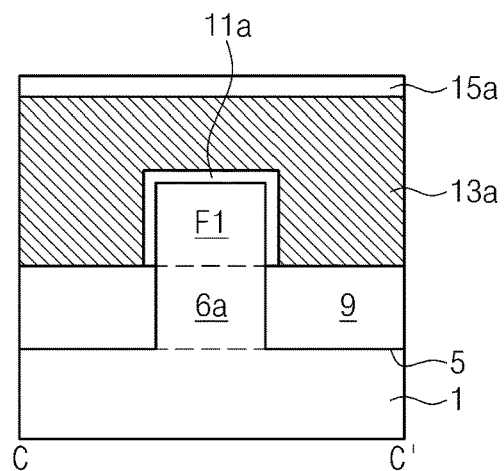

Referring to FIGS. 9a through 9c, a cleaning process may be performed on the substrate 1. A first and a second gate dielectric layer 11a and 11b are then formed on the upper surface (e.g., a top surface) and on sidewalls of the first and second fins F1 and F2, respectively. The first and second gate dielectric layers 11a and 11b may be formed, for example, by using at least one of a thermal oxidation process, a chemical vapor deposition (CVD) process, and an atomic layer deposition (ALD) process. The first and second gate dielectric layers 11a and 11b may be formed, for example, of a silicon oxide. A sacrificial layer and a capping layer may be formed on the first and second gate dielectric layers 11a and 11b and patterned by an etch process. For example, a first sacrificial layer pattern 13a and a first capping layer pattern 15a may be formed on the first gate dielectric layer 11a. A second sacrificial layer pattern 13b and a second capping layer pattern 15b may be formed on the second gate dielectric layer 11b. A first spacer 17a may by formed on both sidewalls of the first sacrificial layer pattern 13a and the first capping layer pattern 15a. A second spacer 17b may be formed on both sidewalls of the second sacrificial layer pattern 13b and the second capping layer pattern 15b. The first and second sacrificial layer patterns 13a and 13b may have etch selectivity with respect to a silicon oxide layer and the first and second capping layers 15a and 15b. The first and second sacrificial layer patterns 13a and 13b may be formed, for example, of a polysilicon layer. The first and second capping layers 15a and 15b may be formed, for example, of a silicon nitride layer. The first and second sacrificial layer patterns 13a and 13b may cover not only an upper portion but also the sidewalls of the first and second fins F1 and F2. In certain embodiments, the first and second sacrificial layer patterns 13a and 13b have a line shape extending in a particular direction.

Figure 10A:
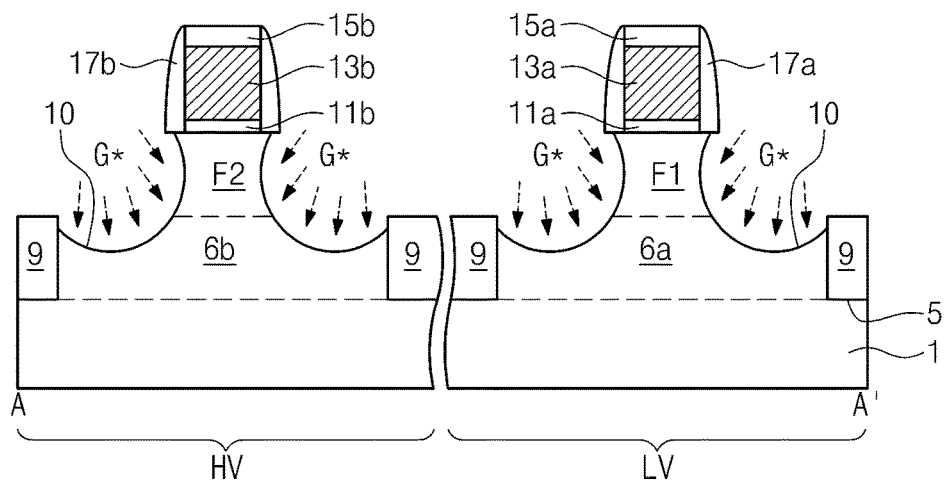
Figure 10B:
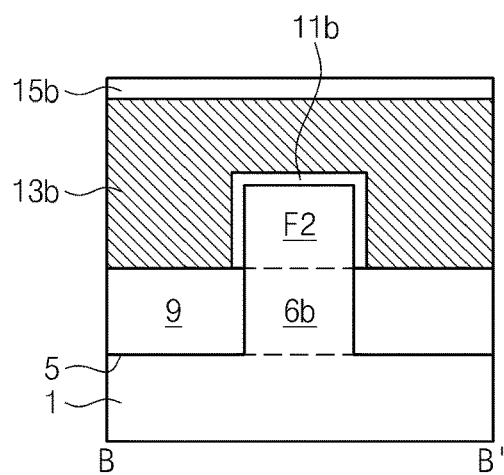
Figure 10C:
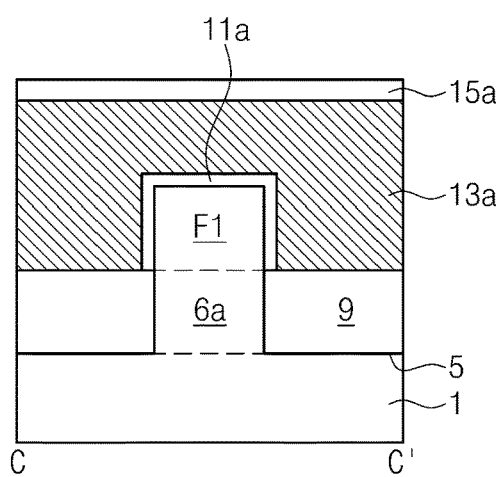

Referring to FIGS. 10a through 10c, a plurality of recess regions 10 may be formed at both sides of the first and second sacrificial layer patterns 13a and 13b, for example, by etching an upper portion of the first and second fins F1 and F2. As a result, a portion of the first and second active regions 6a and 6b are removed. The plurality of recess regions 10 may be formed, for example, by using an isotropic etch process or an anisotropic etch process. In one embodiment, each recess region 10 may have a curved, concave shape. Furthermore, a surface treatment may be performed on the surfaces of the plurality of recess regions 10 by using substantially the same method mentioned above referring to FIGS. 1a and 2a in order to reduce stacking-fault defects which may be formed during the following epitaxial process. For example, the surface treatment may be performed using a plasma gas containing at least one of an inert gas and a hydrogen gas at a temperature of less than or equal to about 700° C. to reduce a root-mean-square average roughness (Rq) of the surfaces of the plurality of recess regions 10. The root-mean-square average roughness (Rq) of the surfaces may become less than or equal to 2 nm after the surface treatment.

Figure 11A:
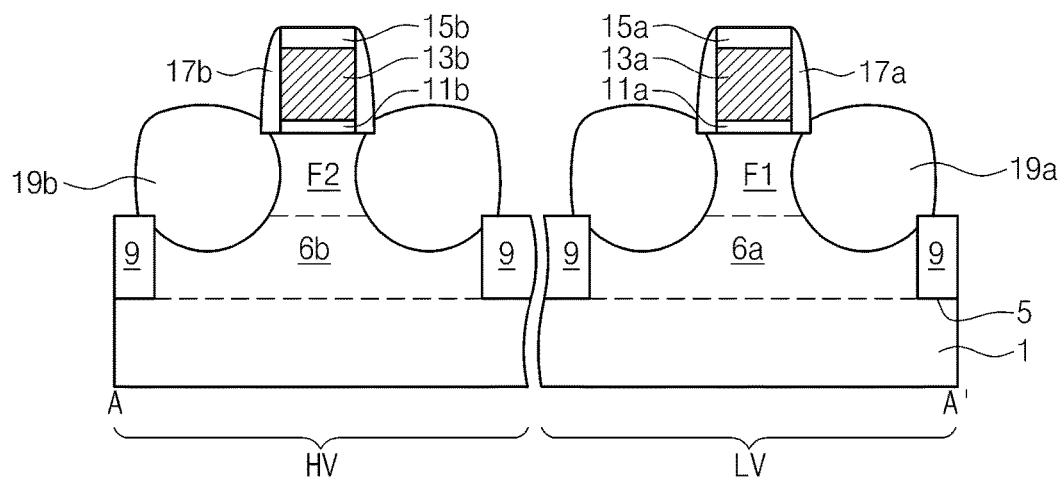
Figure 11B:
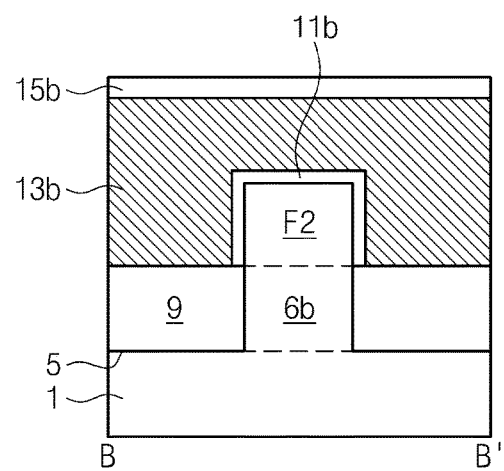
Figure 11C:
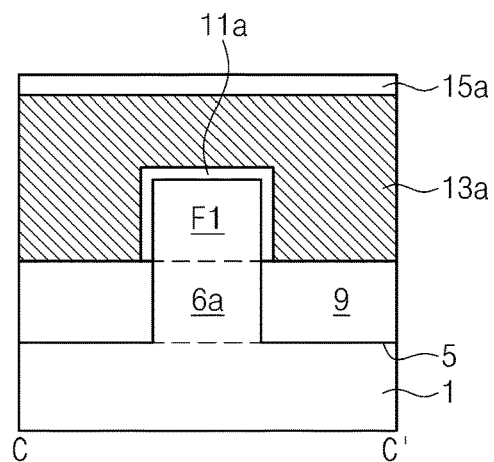

Referring to FIGS. 11a through 11c, a first and a second source/drain epitaxial layer 19a and 19b are formed in the plurality of recess regions 10, for example, by using a selective epitaxial growth (SEG) process or a solid phase epitaxy (SPE) process. The surfaces, being exposed in the plurality of recess regions 10, of the first and second fins F1 and F2 as well as the surfaces of the first and second active regions 6a and 6b may be seed layers during the selective epitaxial growth (SEG) process. At least one of an n-type dopant or a p-type dopant may be injected into the first and second source/drain epitaxial layers 19a and 19b during the SEG process or the SPE process. For example, the n-type or p-type dopant may be injected into the first and second source/drain epitaxial layers 19a and 19b by using an ion implantation process after the SEG process or the SPE process. Thus, in certain embodiments, the upper surfaces of the first and second source/drain epitaxial layers 19a and 19b may have a level higher than that of the bottom of the first and second gate dielectric layers 11a and 11b (e.g., higher than a top surface of the first and second fins F1 and F2).

Figure 12A:
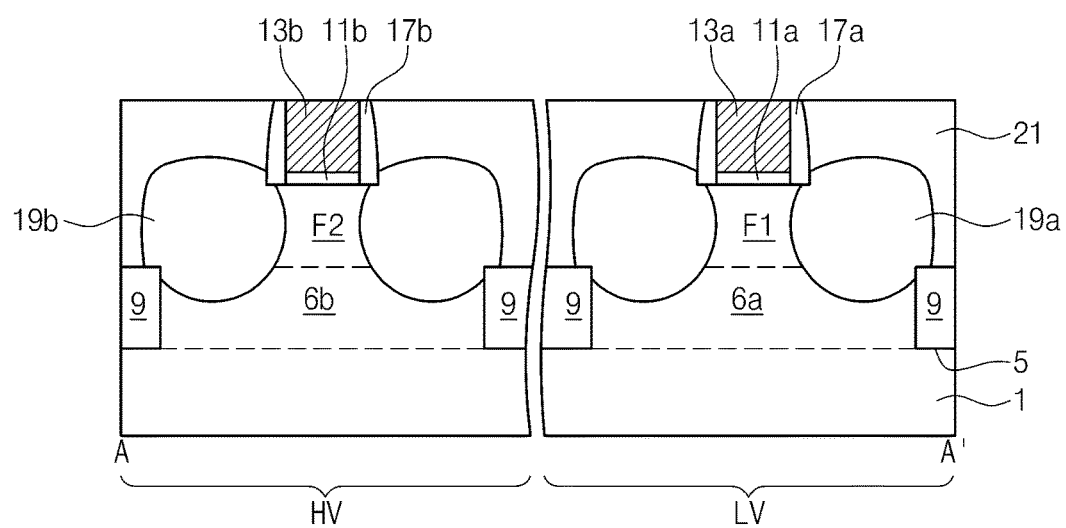
Figure 12B:
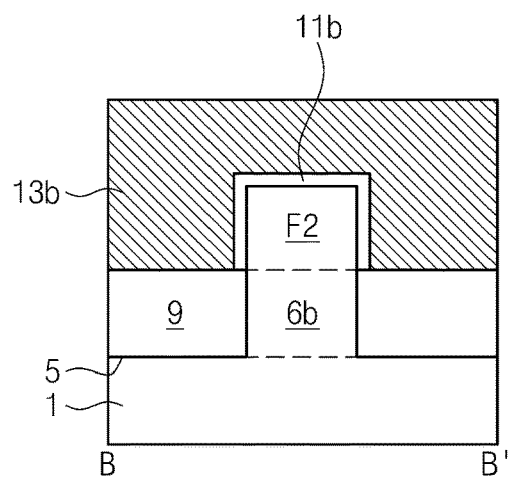
Figure 12C:
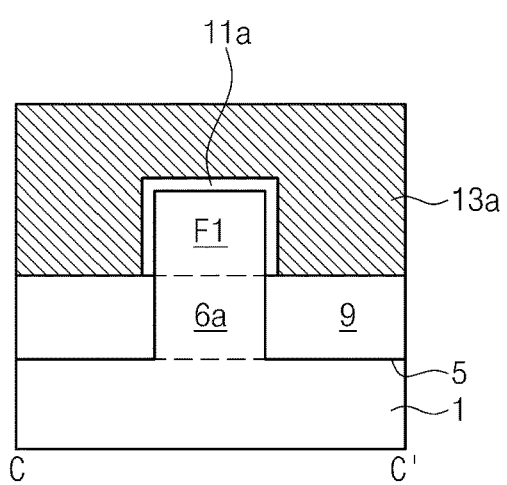

Referring to FIGS. 12a through 12c, an interlayer dielectric layer 21 is formed on the first and second source/drain epitaxial layers 19a and 19b as well as on the first and second capping layers 15a and 15b. The interlayer dielectric layer 21 may then be planarized using a planarization process in order to expose the upper surfaces of the first and second capping layers 15a and 15b. The first and second capping layers 15a and 15b may be removed to expose the upper surfaces of the first and second sacrificial layers 13a and 13b.

Figure 13A:
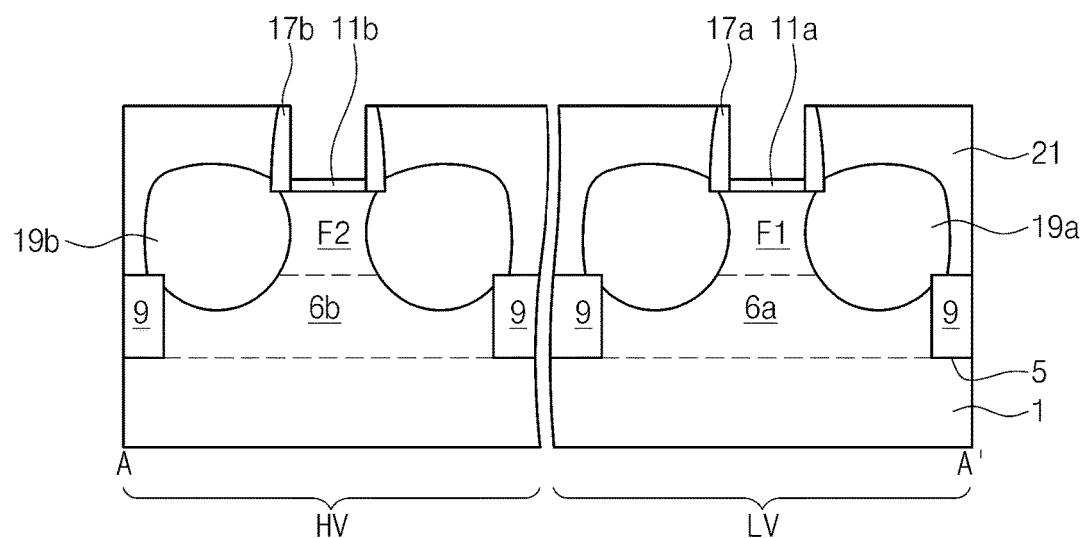
Figure 13B:
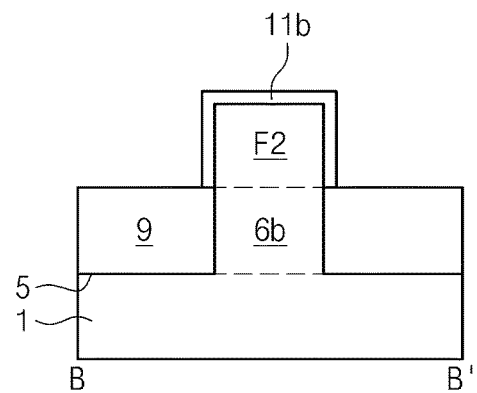
Figure 13C:
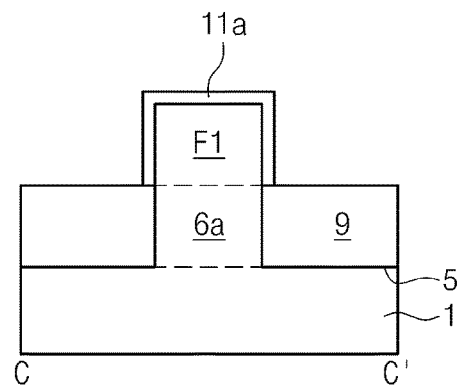

Referring to FIGS. 13a through 13c, the first and second sacrificial layers 13a and 13b are removed to expose not only the first and second gate dielectric layers 11a and 11b but also an upper surface of the device isolation film 9.

Figure 14A:
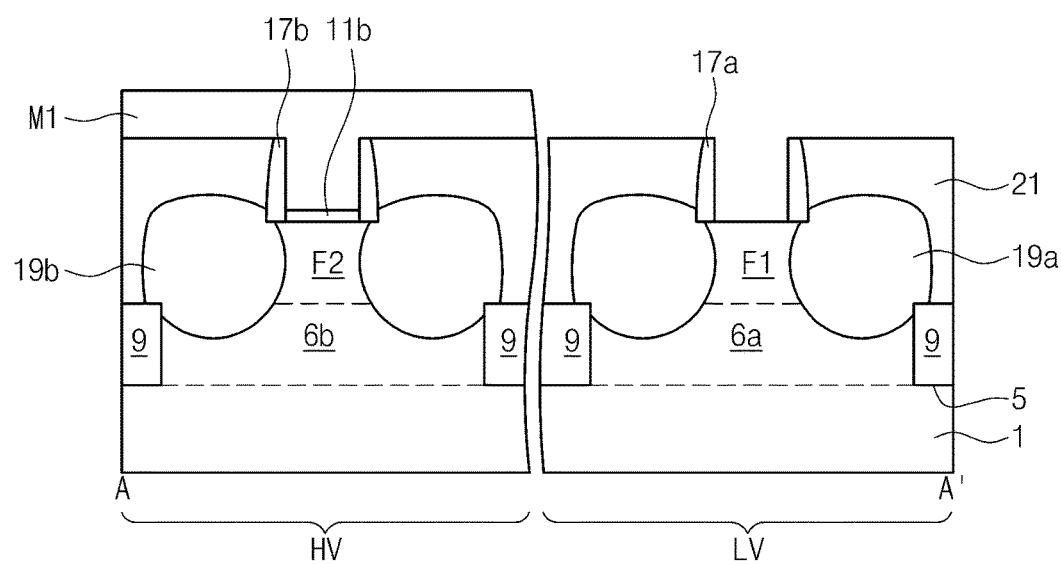
Figure 14B:
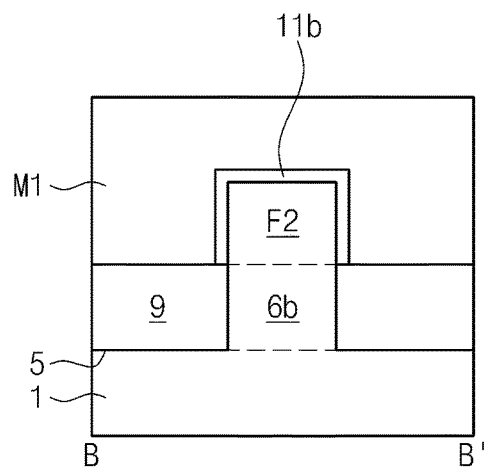
Figure 14C:
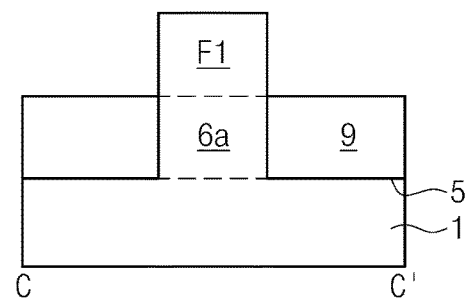

Referring to FIGS. 14a through 14c, a second mask pattern M1, covering the high-voltage transistor region HV and exposing the low-voltage transistor region LV, may be formed on the substrate 1. The first gate dielectric layer 11a in the low-voltage transistor region LV may be removed by an etch process to expose the upper surface and the sidewall of the first fin F1. As a result, the upper surface and the sidewall of the first fin F1 may be damaged by the etch process.

Figure 15A:
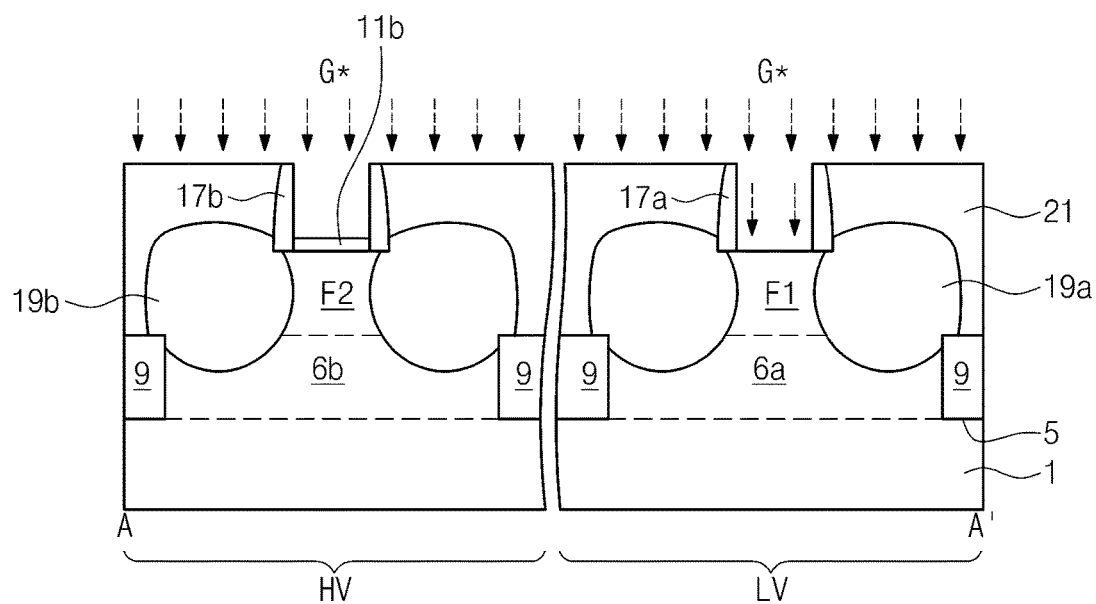
Figure 15B:
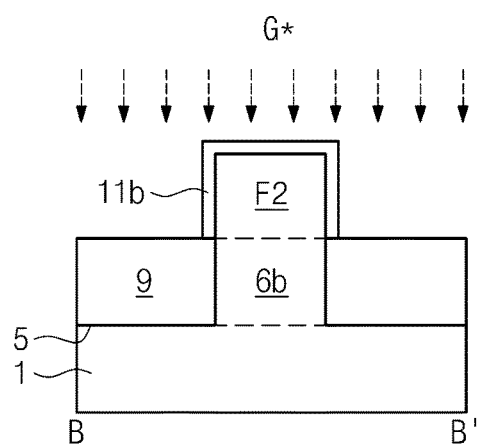
Figure 15C:
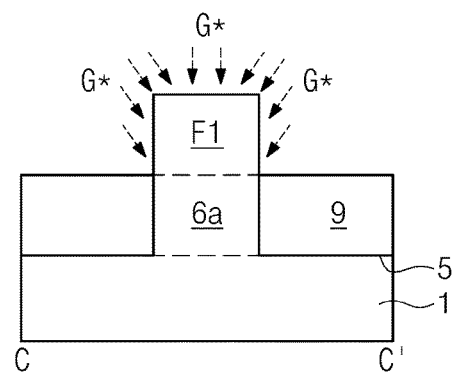

Referring to FIGS. 15a through 15c, the second mask pattern M1 may be removed in order to expose the high-voltage transistor region HV. A surface treatment may be performed on the upper surface and the sidewall of the first fin F1 to cure the damaged surface, for example using substantially the same method mentioned above referring to FIG. 2a. For example, the surface treatment may be performed using a plasma gas containing at least one of an inert gas and a hydrogen gas in a temperature of less than or equal to about 700° C. in order to reduce a root-mean-square average roughness (Rq) of the surface. In one embodiment, the upper surface and the sidewall of the first fin F1 may have a roughness less than that of the upper surface and the sidewall of the second fin F2 because the upper surface and the sidewall of the first fin F1 may be already treated by a previous surface treatment as mentioned above referring FIGS. 8a through 8c.

Figure 16A:
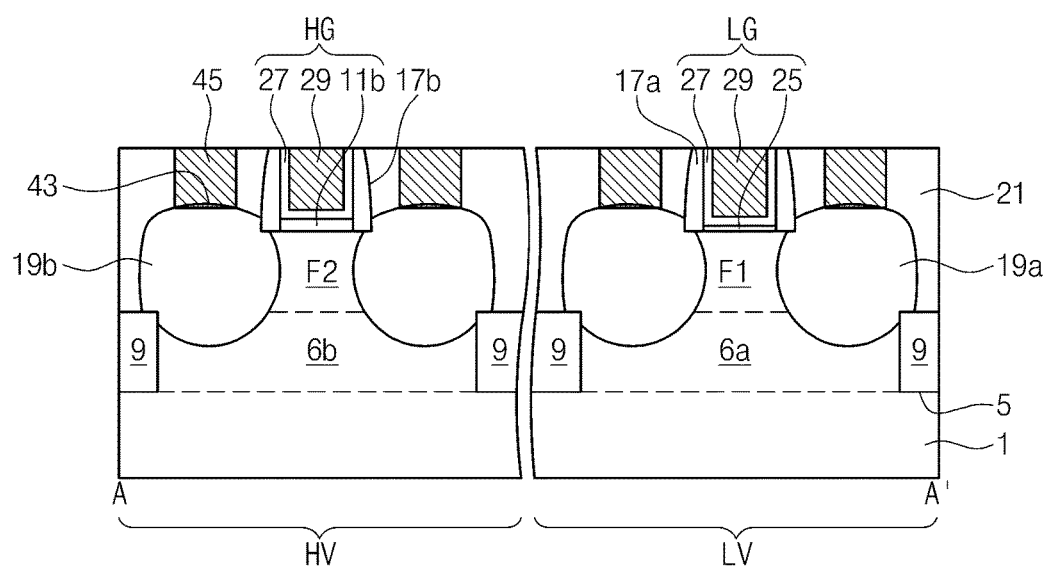
Figure 16B:
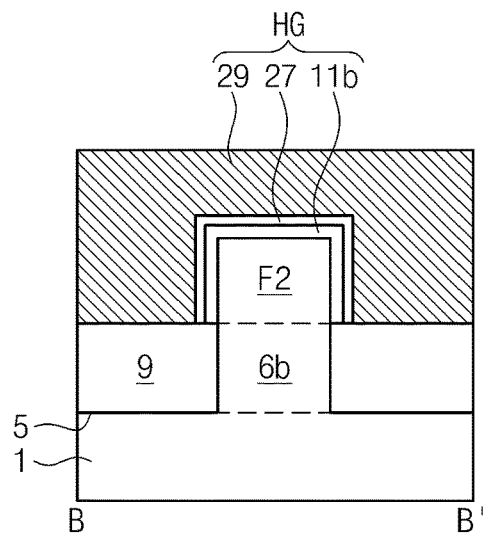
Figure 16C:
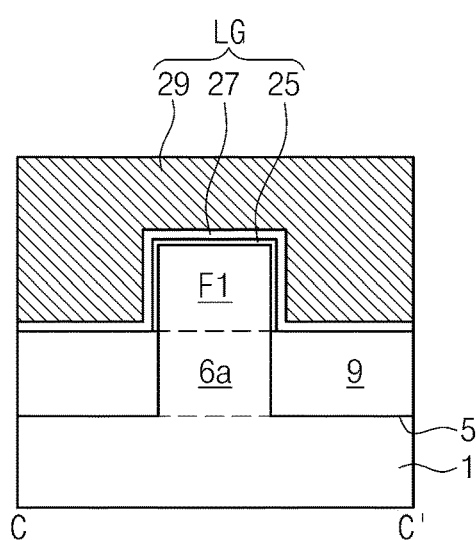

Referring to FIGS. 16a through 16c, a high-k dielectric layer 27 may be formed on the entire surface of the substrate 1. The high-k dielectric layer 27 may be formed on the first fin F1 in the low-voltage transistor region LV and on the second gate dielectric layer 11b formed on the second fin F2 in the high-voltage transistor region HV. The high-k dielectric layer 27 may also be formed on the inner sidewalls of the first and second spacers 17a and 17b. The high-k dielectric layer 27 may include, for example, a hafnium (Hf) oxide layer having a dielectric constant higher than that of a silicon oxide layer. An interface layer 25 may be formed between the high-k dielectric layer 27 and the first fin F1. The interface layer 25 may include, for example, a silicon oxide layer. The interface layer 25 may be formed, for example, prior to the formation of the high-k dielectric layer 27, and in one embodiment, may have a smooth surface that provides a good condition for formation of the high-k dielectric layer 27. A gate electrode layer 29 may be formed on the first and second fins F1 and F2. The gate electrode layer 29 may fill the recess regions where the first and second sacrificial layers 13a and 13b are removed. The gate electrode layer 29 may include, for example, a titanium oxide ($TiO_2$) layer, a tungsten (W) layer, and/or a conductive layer which may control the work-function of the gate electrode layer 29. The gate electrode layer 29 and the high-k dielectric layer 27 may be planarized by a planarization process in order to expose the upper surface of the interlayer dielectric layer 21. Accordingly, a low-voltage gate electrode pattern LG and a high-voltage gate electrode pattern HG are formed on the high-k dielectric layer 27.

Referring again to FIGS. 4a through 4c, a plurality of contact holes which pass through the interlayer dielectric layer 21 and expose the upper surface of the first and second source/drain epitaxial layers 19a and 19b may be formed by performing an etch process. A metal silicide layer 43 may be formed on the upper surface of the first and second source/drain epitaxial layers 19a and 19b by performing a metal silicidation process. A plurality of contact plugs 45 may be formed in the plurality of the contact holes. The contact plugs 45 may therefore connect to the first and second source/drain epitaxial layers 19a and 19b through metal silicide layers 19a and 19b.

Figure 17A:
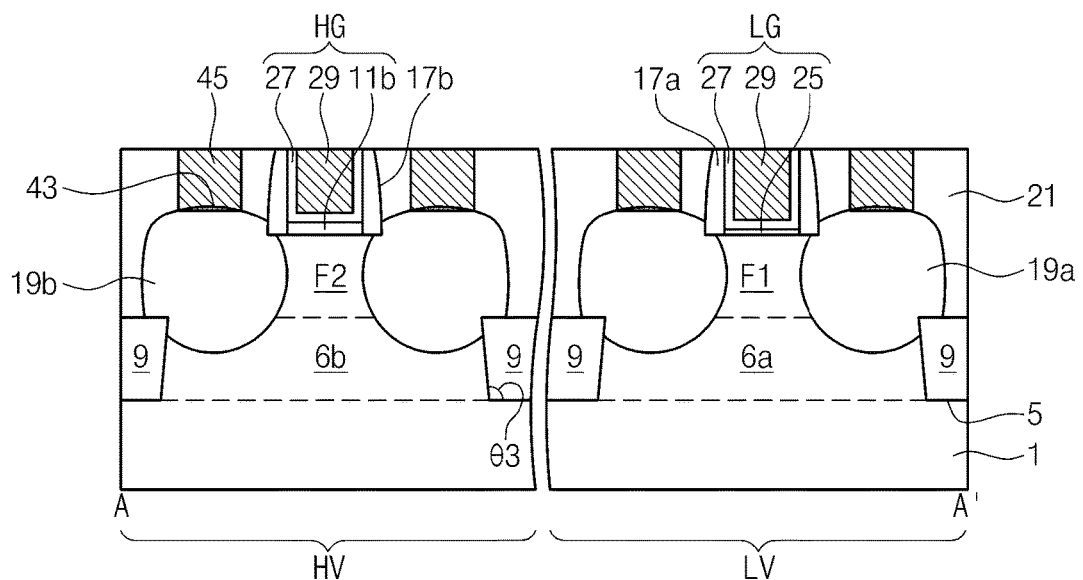
FIGS. 17a through 17c are cross-sectional views illustrating a semiconductor device according to another example embodiment of the inventive concepts corresponding to lines A-A', B-B', and C-C' of FIG. 3.
Figure 17B:
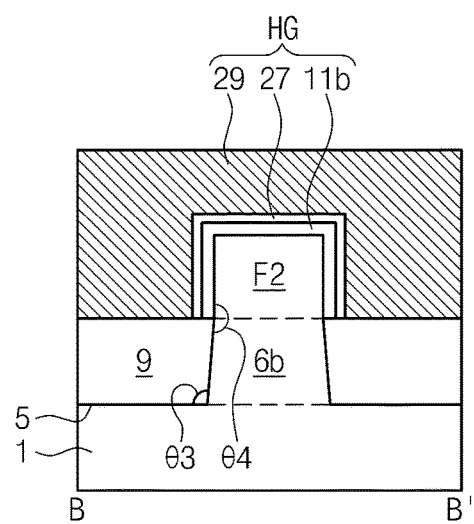
Figure 17C:
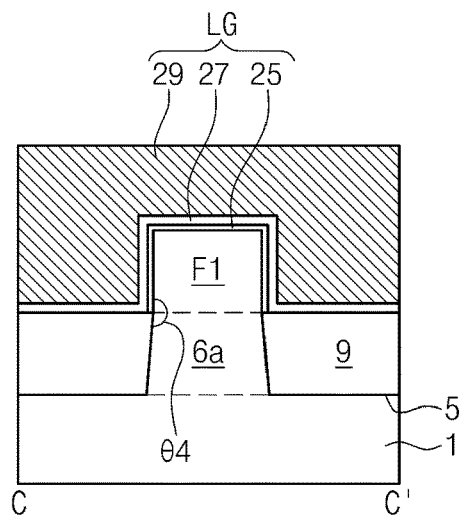

FIGS. 17a through 17c are cross-sectional views illustrating a semiconductor device according to another example embodiment of the inventive concepts corresponding to lines A-A', B-B', and C-C' of FIG. 3.

Referring to FIGS. 17a through 17c, a third angle θ3 formed between the sidewall and the bottom of the device isolation film 9 may be greater than about 90°, i.e., the sidewall of the device isolation film 9 may be inclined. A fourth angle θ4, which is formed between the sidewall of the first fin F1 and the sidewall of the first active region 6a or between the sidewall of the second fin F2 and the sidewall of the second active region 6b, may be greater than 180°. A middle width, which is adjacent to the upper surface of the device isolation region 9, of the first or the second fin F1 or F2 may have substantially the same width as an upper width of the upper surface of the first or the second fin F1 or F2. The upper width of the upper surface of the first or the second fin F1 or F2 may be less than that of a bottom width of the first or the second fin F1 or F2.

FIGS. 18a through 21a are cross-sectional views illustrating a method of manufacturing a semiconductor device corresponding to FIG. 17a. FIGS. 18b through 21b are cross-sectional views illustrating a method of manufacturing a semiconductor device corresponding to FIG. 17b. FIGS. 18c through 21c are cross-sectional views illustrating a method of manufacturing a semiconductor device corresponding to FIG. 17c.

Figure 18A:
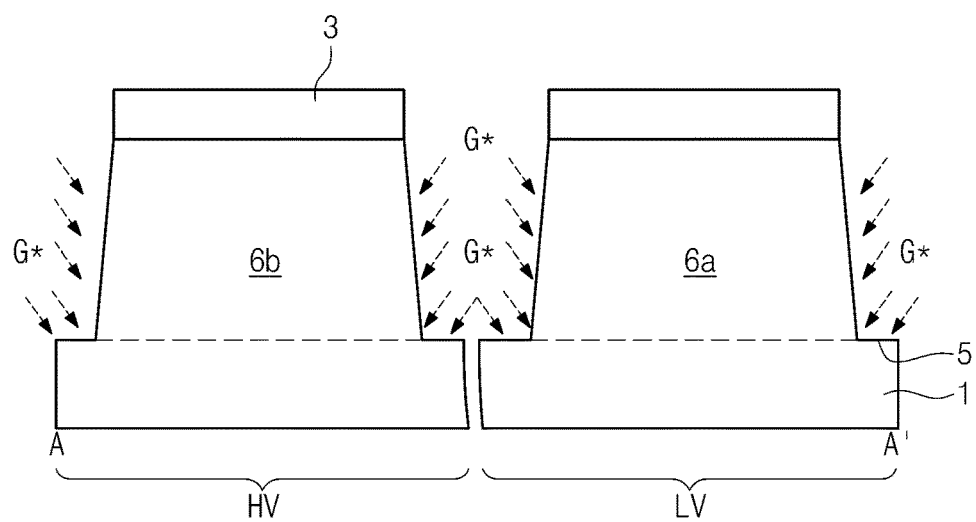
Figure 18B:
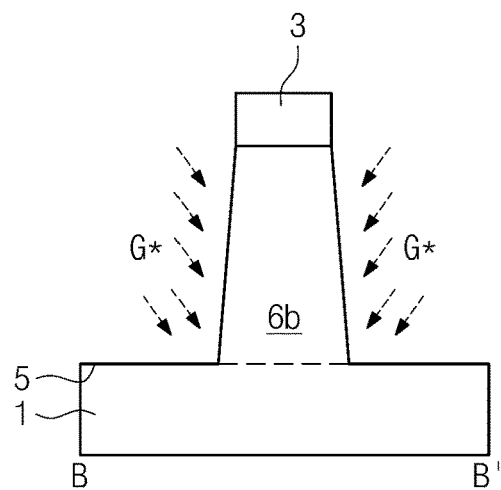
Figure 18C:
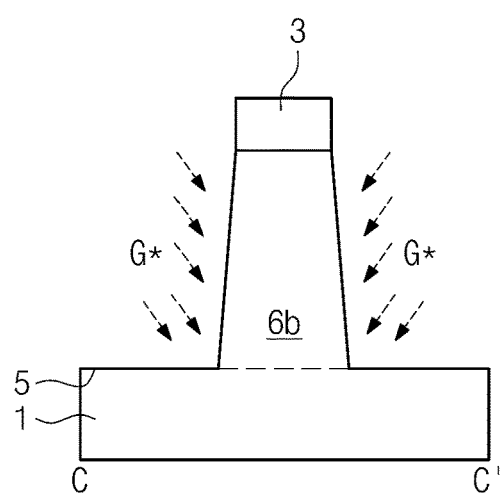
Figure 19A:
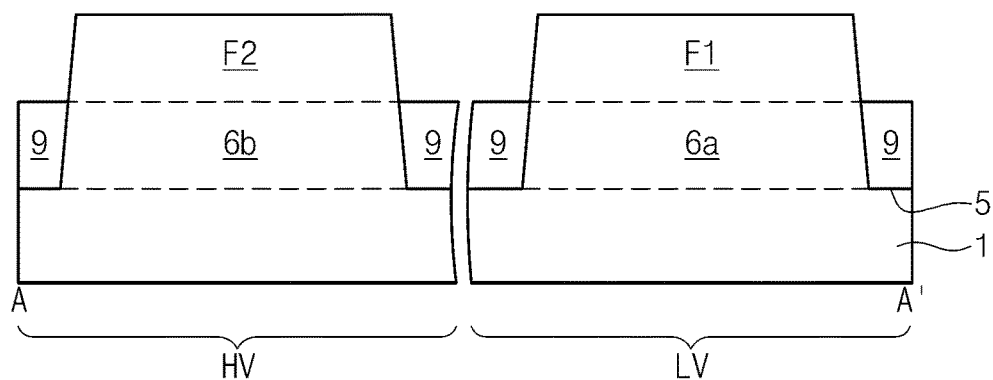
Figure 19B:
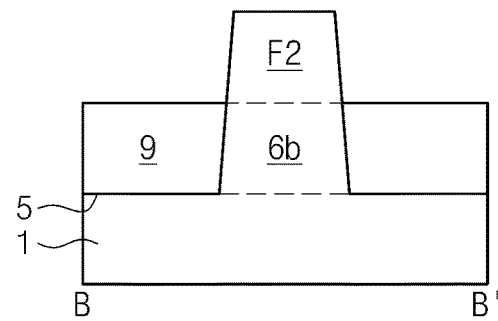
Figure 19C:
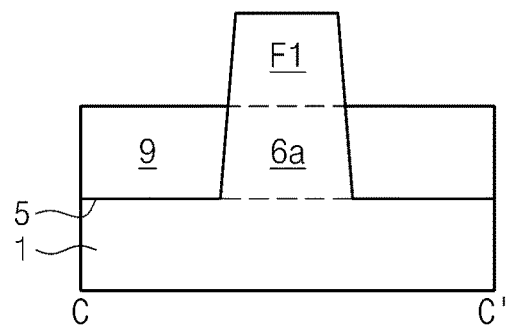

Referring to FIGS. 18a through 18c, a first mask pattern 3, defining a first active region 6a in the low-voltage transistor region LV and a second active region 6b in the high-voltage transistor region HV, may be formed on the substrate 1. The substrate 1 may be etched by an etch process using the first mask pattern 3 as an etch mask to form a trench 5, the first active region 6a, and the second active region 6b. At this point, the sidewalls of the trench 5 may be inclined and the surfaces at the bottom and sidewalls of the trench 5 may be damaged and be roughened by the etch process. If a device isolation film 9, shown in FIGS. 19a through 19c, is formed in the trench 5 having the damaged and roughened surface, it may cause some malfunction of the semiconductor device. Therefore, a surface treatment may be performed on the surfaces at the bottom and the sidewalls of the trench 5 in order to cure the damaged and roughened surfaces. The surface treatment may be performed, for example, using a helium plasma gas in a pressure of about 5 Torr to about 25 Torr, a power of about 2 kW to about 4 kW, and a temperature of about 300° C. to about 500° C. The sidewall of the trench 5 may remain inclined after performing the surface treatment even though the damaged and roughened surfaces have been cured.

Referring to FIGS. 19a through 19c, a device isolation film 9 is formed in the trench 5. The device isolation film 9 may be formed, for example, by a chemical vapor deposition (CVD) process and recessed by using an etch-back process in order to form a first and a second fin F1 and F2. The first mask pattern 3 may be removed. The upper surfaces and the sidewalls of the first and second fins F1 and F2 may be damaged and roughened by the etch-back process.

Figure 20A:
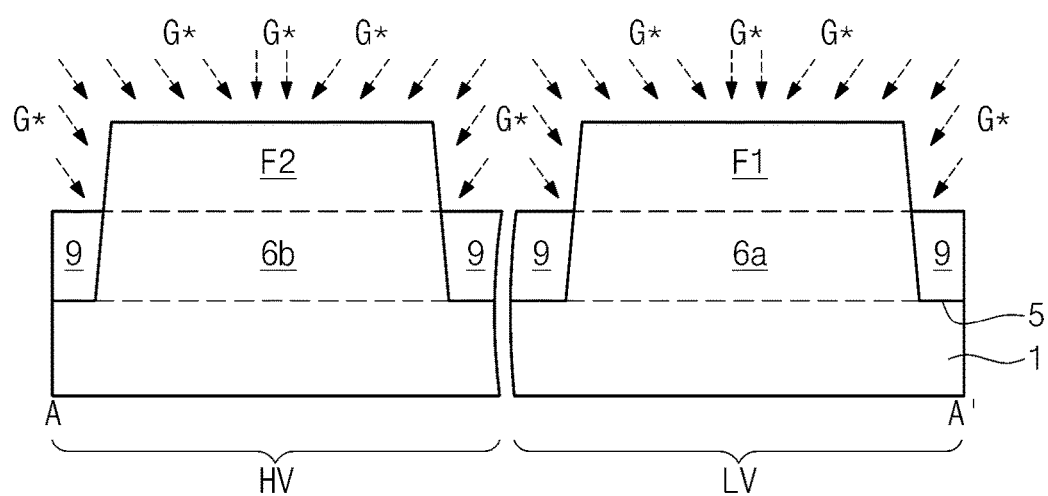
Figure 20B:
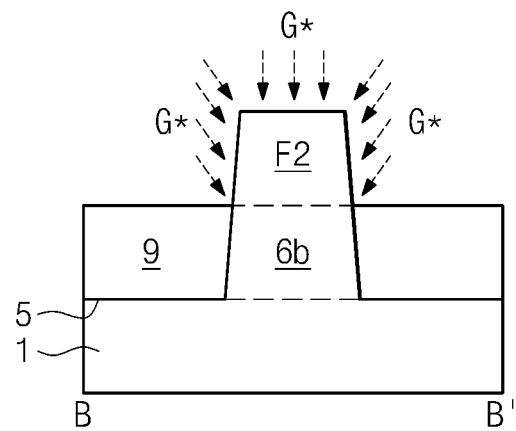
Figure 20C:
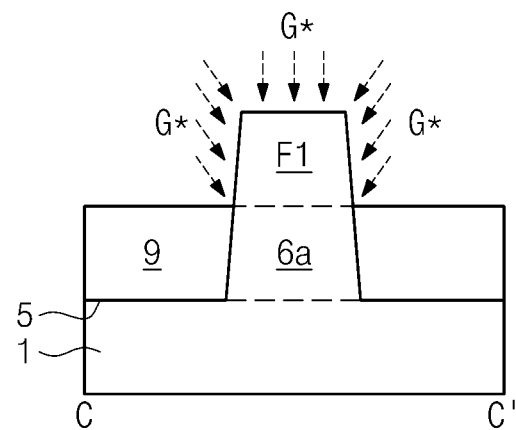

Referring to FIGS. 20a through 20c, a surface treatment may be performed on the exposed surfaces of the first and second fins F1 and F2 using substantially the same method mentioned above referring to FIGS. 1a and 2a. For example, the surface treatment may be performed by two separate processes of a first and a second surface treatment. The first surface treatment may be performed in order to cure the damaged surface and the second surface treatment may be performed in order to change the inclined shape of the sidewalls of the first and second fins F1 and F2. In one embodiment, the first surface treatment may be performed using a helium plasma gas at a pressure of about 5 Torr to about 25 Torr, a power of about 2 kW to 4 kW, and a temperature of about 300° C. to about 500° C. The second surface treatment may be performed using a hydrogen plasma gas at a pressure of less than about 1 Torr, a power of about 2 kW to about 4 kW, and a temperature of about 300° C. to about 500° C.

Figure 21A:
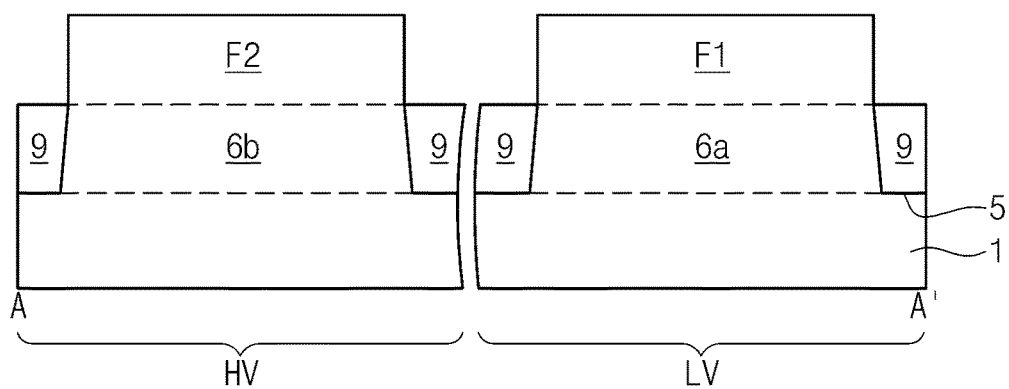
Figure 21B:
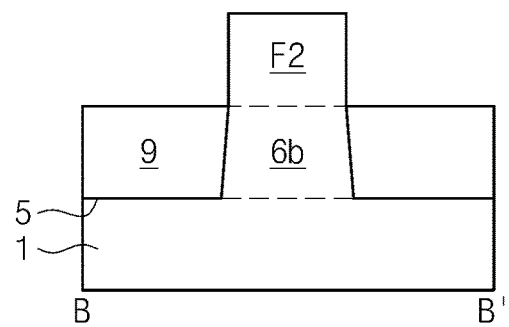
Figure 21C:
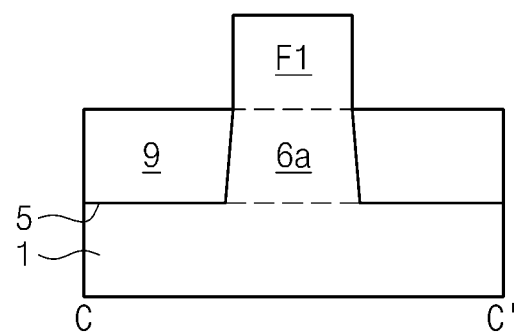

Referring to FIGS. 21a through 21c, the angles between the upper surfaces and the sidewalls of the first and second fins F1 and F2 may be changed to about 90° after the first and second surface treatments. A gate dielectric layer, a high-k dielectric layer, and a gate electrode layer may be formed on the first or the second fin F1 or F2 using substantially the same method mentioned above.

As a result of performing the surface treatments mentioned above to a semiconductor device having a FinFET, it was experimentally confirmed that the surface roughness of the fin was improved about 35%, compared to a surface roughness in a conventional fin (e.g., in one series of experiments, a surface area was improved from having a root-mean-square average roughness of about 3.1 nm to a root-mean-square average roughness of about 2 nm), and the electron mobility in the channel region of the FinFET is improved about 13%. It was also experimentally confirmed that the sheet resistance of the fin was reduced about 8% and the on-current of the FinFET was increased about 7%.

Figure 22:
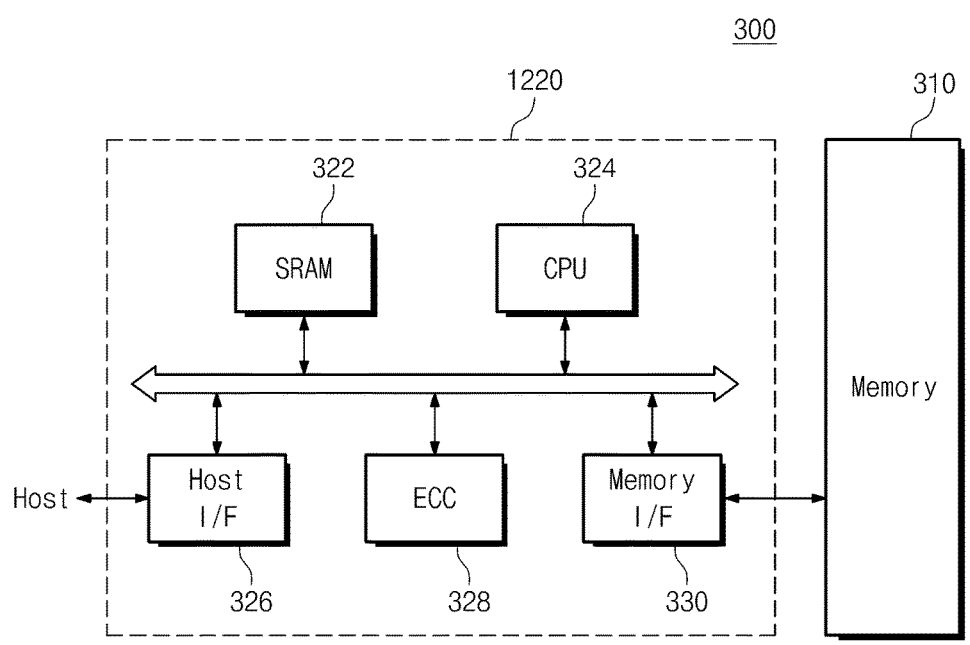
FIG. 22 is a schematic block diagram illustrating a memory card including a semiconductor device according to an example embodiment of the inventive concepts.

FIG. 22 is a schematic block diagram illustrating a memory card including a semiconductor device according to an example embodiment of the inventive concepts.

Referring to FIG. 22, a memory card 300 may include a memory device 310. The memory device 310 may include at least one of the semiconductor devices according to the example embodiments of the inventive concepts as mentioned above. The memory device 310 may include, for example, at least one of a non-volatile memory device (e.g., a magnetic random access memory device, a phase change random access memory device, etc), a dynamic random access memory (DRAM) device, and/or a static random access memory (SRAM) device. The memory device may be included in a semiconductor device such as a semiconductor chip formed from a wafer, or a semiconductor package, or a package-on-package semiconductor device. The memory card 300 may include a memory controller 320 that controls data communication between a host and the memory device 310.

The memory controller 320 may include a central processing unit (CPU) 324 that controls overall operations of the memory card 300. In addition, the memory controller 320 may include a SRAM device 322 performed as an operation memory of the CPU 324. Moreover, the memory controller 320 may further include a host interface unit 326 and a memory interface unit 330. The host interface unit 326 may be configured to include a data communication protocol between the memory card 300 and the host. The memory interface unit 330 may connect the memory controller 320 to the memory device 310. The memory controller 320 may further include an error correction code (ECC) block 328. The ECC block 328 may detect and correct errors of data which are read out from the memory device 310. The memory card 300 may be used as, for example, a portable data storage card. Alternatively, the memory card 300 may be realized as, for example, solid state disks (SSD) which are used as hard disks of computer systems.

Though not shown, a method of manufacturing a memory device 310 of the memory card 300 such as shown in FIG. 22 may include the steps described above in connection with FIGS. 5A-21C. For example, the method of forming a memory device 310 such as shown in FIG. 22, may include providing a package substrate, forming at least one memory chip using one or more of the steps described in FIGS. 5A-21C, mounting the at least one memory chip on the package substrate, and encapsulating the package substrate and memory chip with an encapsulant. Other, or different steps may be included as well.

Figure 23:
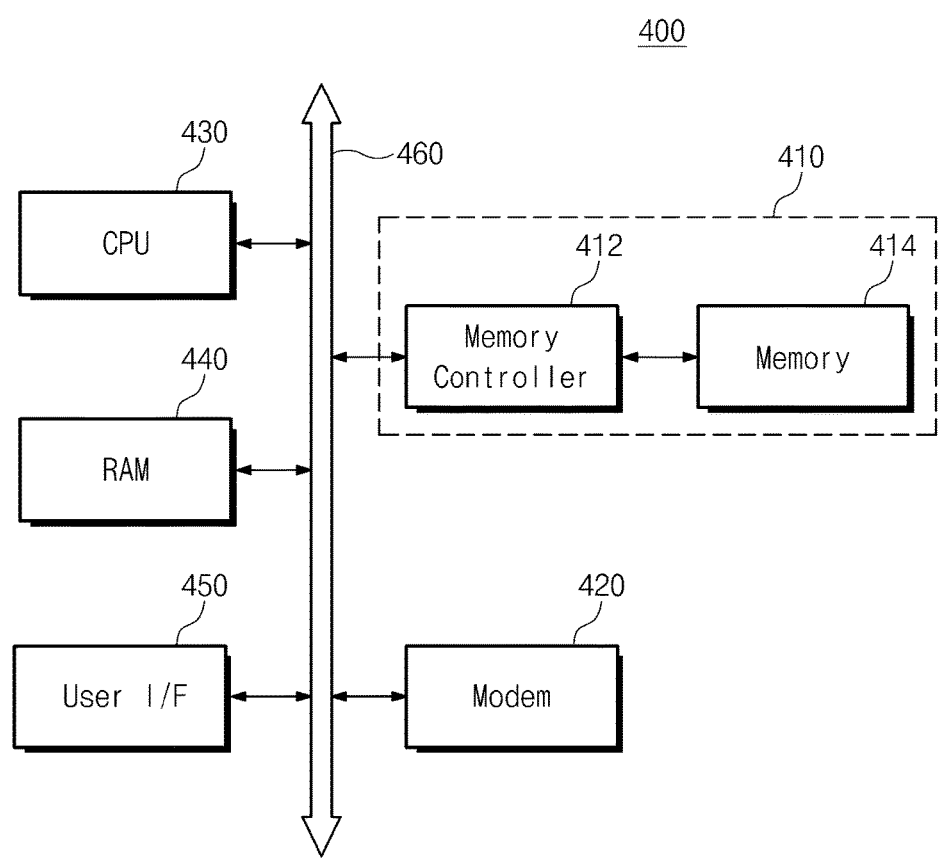
FIG. 23 is a schematic block diagram illustrating an example of information processing systems including a semiconductor device according to an example embodiment of the inventive concepts.

FIG. 23 is a schematic block diagram illustrating an example of information processing systems including a semiconductor device according to an example embodiment of the inventive concepts.

Referring to FIG. 23, a memory system 410 including the semiconductor device according to an embodiment of the inventive concept may be installed in an information process system 400 such as a mobile device or a desk top computer. The information process system 400 may include a modem 420, a central processing unit (CPU) 430, a random access memory (RAM) 440, and a user interface unit 450 that are electrically connected to the memory system 410 through a system bus 460. Data processed by the CPU 430 or data inputted form the outside of memory system 410 may be stored in the memory system 410. Here, the memory system 410 may be realized as a solid state disk (SSD) device, and may include one or more semiconductor devices such as described above in connection with FIGS. 1-21C. In this case, the information processing system 400 may stably store massive data in the memory system 410. Additionally, as the reliability of the memory system 410 increases, the memory system 410 may reduce a resource consumed for correcting errors. Even though not shown in the drawings, an application chipset, a camera image processor (CIS), and/or an input/output unit may further be provided in the information processing system 400.

While the disclosure has been described with reference to example embodiments, it will be apparent to those skilled in the art that various changes and modifications may be made without departing from the spirits and scopes of the disclosed embodiments. Therefore, it should be understood that the above embodiments are not limiting, but illustrative, and the scope of the inventive concepts are to be determined by the broadest permissible interpretation of the following claims and their equivalents, and shall not be restricted or limited by the foregoing description.

What is claimed is:

1. A semiconductor device, comprising:
   a substrate including a high-voltage transistor region and a low-voltage transistor region;
   a first gate dielectric layer on the substrate in the high-voltage transistor region;
   a first gate electrode pattern on the first gate dielectric layer;
   a second gate dielectric layer on the substrate in the low-voltage transistor region;
   a second gate electrode pattern on the second gate dielectric layer;
   a first root-mean-square average roughness of the substrate adjoining the first gate dielectric layer; and
   a second root-mean-square average roughness of the substrate adjoining the second gate dielectric layer,
   wherein the second root-mean-square average roughness is less than the first root-mean-square average roughness.

2. The semiconductor device of claim 1, wherein the first and the second root-mean-square average roughness are less than about 2 nm.

3. The semiconductor device of claim 1, further comprising:
   a first fin protruding from the substrate in the high-voltage transistor region, the first fin having a first upper surface and a first sidewall;
   a second fin protruding from the substrate in the low-voltage transistor region, the second fin having a second upper surface and a second sidewall;
   wherein the first gate dielectric layer adjoins the first upper surface and the first sidewall and wherein the second gate dielectric layer adjoins the second upper surface and the second sidewall; and
   wherein the first upper surface and the first sidewall have a first surface roughness and wherein the second upper surface and the second sidewall have a second surface roughness less than the first surface roughness.

4. The semiconductor device of claim 3, further comprising a device isolation film adjoining lower sidewalls of the first and second fins,
   wherein the first and the second root-mean-square average roughness of the first and second fins adjoining the device isolation film are less than about 2 nm, respectively.

5. The semiconductor device of claim 3, further comprising:
- a first source/drain epitaxial layer on the first fin adjacent the first gate electrode pattern; and
- a second source/drain epitaxial layer on the second fin adjacent the second gate electrode pattern.

6. A semiconductor device, comprising:
- a fin protruding from a substrate, the fin having an upper surface, a lower sidewall, and an upper sidewall;
- a device isolation film on the substrate, the device isolation film having an upper surface and covering the lower sidewall of the fin;
- an inner angle formed between the upper sidewall and the lower sidewall of the fin,
- wherein the inner angle is greater than about 180°;
- a first width at the upper surface of the fin between a top of the upper sidewall and a top of an opposite upper sidewall; and
- a second width at a middle portion of the fin between a bottom of the upper sidewall and a bottom of the opposite upper sidewall, the middle portion of the fin being at substantially the same vertical level as the upper surface of the device isolation film,
- wherein the first width is the same as the second width.

7. The semiconductor device of claim 6, further comprising:
- a third width at a bottom of the fin between the lower sidewall and an opposite lower sidewall,
- wherein the second width is less than the third width.

8. The semiconductor device of claim 6,
- wherein the upper sidewall of the fin is substantially vertical, and the lower sidewall of the fin is not substantially vertical.

9. The semiconductor device of claim 6,
- wherein an angle between the upper surface of the fin and the upper sidewall of the fin is substantially 90°.

10. A semiconductor device, comprising:
- a substrate including a high-voltage transistor region and a low-voltage transistor region;
- a first fin protruding from the substrate at the high-voltage transistor region;
- a second fin protruding from the substrate at the low-voltage transistor region; and
- a device isolation film on the substrate, the device isolation film covering lower sidewalls of the first and second fins,
- wherein an upper surface of the first fin has a first root-mean-square average roughness,
- wherein an upper surface of the second fin has a second root-mean-square average roughness, and
- wherein the second root-mean-square average roughness is less than the first root-mean-square average roughness.

11. The semiconductor device of claim 10, wherein an inner angle is formed between an upper sidewall and the lower sidewall of the first fin, and
- wherein the inner angle is greater than about 180°.

12. The semiconductor device of claim 11, wherein the upper sidewall of the first fin is substantially vertical, and the lower sidewall of the first fin is not substantially vertical.

13. The semiconductor device of claim 11, wherein an angle between the upper surface of the first fin and the upper sidewall of the first fin is substantially 90°.

14. The semiconductor device of claim 10, wherein a first width of the upper surface of the first fin is the same as a second width of a middle portion of the first fin, and
- wherein the middle portion of the first fin is at substantially the same vertical level as an upper surface of the device isolation film.

15. The semiconductor device of claim 10, further comprising:
- a first gate dielectric layer on the first fin in the high-voltage transistor region;
- a first gate electrode pattern on the first gate dielectric layer;
- a second gate dielectric layer on the second fin in the low-voltage transistor region; and
- a second gate electrode pattern on the second gate dielectric layer,
- wherein the upper surface of the first fin adjoins the first gate dielectric layer, and
- wherein the upper surface of the second fin adjoins the second gate dielectric layer.

* * * * *